US008293623B2

(12) United States Patent
Momose et al.

(10) Patent No.: US 8,293,623 B2
(45) Date of Patent: Oct. 23, 2012

(54) EPITAXIAL SIC SINGLE CRYSTAL SUBSTRATE AND METHOD OF MANUFACTURE OF EPITAXIAL SIC SINGLE CRYSTAL SUBSTRATE

(75) Inventors: Kenji Momose, Chichibu (JP); Michiya Odawara, Chichibu (JP); Keiichi Matsuzawa, Kumagaya (JP); Hajime Okumura, Tsukuba (JP); Kazutoshi Kojima, Tsukuba (JP); Yuuki Ishida, Tsukuba (JP); Hidekazu Tsuchida, Yokosuka (JP); Isaho Kamata, Tokyo (JP)

(73) Assignees: Showa Denko K.K., Tokyo (JP); National Institute of Advanced Industrial Science and Technology, Tokyo (JP); Central Research Institute of Electric Power Industry, Tokyo (JP)

( * ) Notice: Subject to any disclaimer, the term of this patent is extended or adjusted under 35 U.S.C. 154(b) by 324 days.

(21) Appl. No.: 12/677,255

(22) PCT Filed: Sep. 12, 2008

(86) PCT No.: PCT/JP2008/066571
§ 371 (c)(1),
(2), (4) Date: Mar. 9, 2010

(87) PCT Pub. No.: WO2009/035095
PCT Pub. Date: Mar. 19, 2009

(65) Prior Publication Data
US 2011/0006309 A1 Jan. 13, 2011

(30) Foreign Application Priority Data

Sep. 12, 2007 (JP) ................................. 2007-236661
Aug. 20, 2008 (JP) ................................. 2008-211757

(51) Int. Cl.
*H01L 21/20* (2006.01)
*H01L 21/36* (2006.01)
(52) U.S. Cl. ................. 438/478; 438/413; 257/E21.092
(58) Field of Classification Search ................. 438/478, 438/413, 416, 417; 257/77, E21.092, E21.09
See application file for complete search history.

(56) References Cited

U.S. PATENT DOCUMENTS
2006/0107890 A1 5/2006 Hobgood et al.
(Continued)

FOREIGN PATENT DOCUMENTS
JP 2006-321707 A 11/2006
(Continued)

OTHER PUBLICATIONS

Tsutomu Hori, et al., "Fast homoepitaxial growth of 4H-SiC with low basal-plane dislocation density and low trap concentration by hot-wall chemical vapor deposition", Journal of Crystal Growth, 2007, pp. 297-302, vol. 306.

(Continued)

*Primary Examiner* — Chuong A Luu
*Assistant Examiner* — Nga Doan
(74) *Attorney, Agent, or Firm* — Sughrue Mion, PLLC

(57) ABSTRACT

An epitaxial SiC single crystal substrate including a SiC single crystal wafer whose main surface is a c-plane or a surface that inclines a c-plane with an angle of inclination that is more than 0 degree but less than 10 degrees, and SiC epitaxial film that is formed on the main surface of the SiC single crystal wafer, wherein the dislocation array density of threading edge dislocation arrays that are formed in the SiC epitaxial film is 10 arrays/cm$^2$ or less.

14 Claims, 11 Drawing Sheets

U.S. PATENT DOCUMENTS

2007/0148919 A1* 6/2007 Lin et al. .................. 438/478
2009/0179259 A1* 7/2009 Wang et al. ................ 257/330

FOREIGN PATENT DOCUMENTS

| JP | 2007-131504 A | 5/2007 |
|---|---|---|
| JP | 2008-004888 A | 1/2008 |
| JP | 2008-115034 A | 5/2008 |
| TW | 200539318 | 12/2005 |

OTHER PUBLICATIONS

X. Zhang, et al., "Morphology of basal plane dislocations in 4H-SiC homoepitaxial layers grown by chemical vapor deposition", Journal of Applied Physics, 053517, 2007, 8 pages, vol. 101.

H. Jacobson, et al., "Properties and origins of different stacking faults that cause degradation in SiC PiN diodes", Journal of Applied Physics, Feb. 1, 2004, pp. 1485-1488, vol. 95, No. 3.

S. Ha, et al., "Dislocation nucleation in 4H silicon carbide epitaxy", Journal of Crystal Growth, 2004, pp. 130-138, vol. 262.

A.A. Burk Jr., et al.; "SiC epitaxial layer growth in a novel multi-wafer vapor-phase epitaxial (VPE) reactor"; Journal of Crystal Growth; vol. 200; Apr. 1, 1999; pp. 458-466; XP004168207.

A.A. Burk, et al.; "Large Area SiC Epitaxial Layer Growth in a Warm-Wall Planetary VPE Reactor"; Material Science Forum; vols. 483-485; May 2005; pp. 137-140; XP009152060.

Christer Hallin, et al.; "The Effect of Thermal Gradients on SiC Wafers"; Materials Science Forum; vols. 433-436; Sep. 2003; pp. 193-196; XP-002658904.

Daisuke Nakamura, et al; "Ultrahigh-quality silicon carbide single crystals"; Nature; vol. 430; Aug. 26, 2004; pp. 1009-1012; XP-002642759.

Extended European Search Report dated Oct. 27, 2011 for corresponding European Patent Application No. EP 08 82 9974.

O. Danielsson, et al.; "Reducing stress in silicon carbide epitaxial layers"; Journal of Crystal Growth; vol. 252; Mar. 10, 2003; pp. 289-296; XP027392426.

S. Ha, et al.; "Dislocation conversion in 4H silicon carbide epitaxy"; Journal of Crystal Growth; vol. 244; Sep. 20, 2002; pp. 257-266; XP004382432.

Taiwanese Patent Office, "Office Action," issued in connection with Taiwanese Patent Application No. 097135187, dated Jul. 30, 2012.

\* cited by examiner

AREA WHERE
INTERFACILA
DISLOCATION
IS GENERATED

EPITAXIAL SIC SINGLE CRYSTAL SUBSTRATE AND METHOD OF MANUFACTURE OF EPITAXIAL SIC SINGLE CRYSTAL SUBSTRATE

TECHNICAL FIELD

The present invention relates to an epitaxial SiC single crystal substrate, and a method of manufacture of the epitaxial SiC single crystal substrate.

Priority is claimed on Japanese Patent Application No. 2007-236661, filed Sep. 12, 2007, and Japanese Patent Application No. 2008-211757, filed Aug. 20, 2008, the content of which is incorporated herein by reference.

BACKGROUND ART

Silicon carbide (SiC) is a semiconductor with a large bandgap relative to silicon (Si), and applications to power devices, high-frequency devices, high-temperature operation devices and the like are anticipated.

There exist many polytypes of SiC, but the polytype which is used in order to fabricate SiC electronic devices for practical use is 4H-SiC. As substrates used in manufacturing SiC electronic devices, ordinarily, SiC single crystal wafers are used which are formed from bulk crystal fabricated by the sublimation method, etc., and on top of which is formed SiC epitaxial growth film constituting the active region of the SiC semiconductor device.

SiC single crystal wafers generally incorporate crystal defects called threading screw dislocations (TSD) and threading edge dislocations (TED), or basal plane dislocations (BPD), and these crystal defects may result in degradation of device properties. These dislocations are basically propagated from the SiC single crystal wafer to the SiC epitaxial film. Threading screw dislocation is primarily a dislocation where the Burgers vector which is propagated along the c-axis is nc[0001]. Threading edge dislocation is primarily a dislocation where the Burgers vector which is propagated along the c-axis is a/3<11-20>. Furthermore, basal plane dislocation is a dislocation where the Burgers vector existing on the c-plane is a/3<11-20.

On the other hand, it is known that dislocations called misfit dislocations also occur within SiC epitaxial film (see Non-Patent Documents 1 and 2). These misfit dislocations are one of the basal plane dislocations that are propagated to SiC epitaxial film, and are dislocations where elongation occurs in a direction orthogonal to the offcut direction (in the case where the offcut direction is <11-20>, it would be the <1-100> direction) of the SiC single crystal wafer in the vicinity of the interface of the SiC single crystal wafer and the SiC epitaxial film. With respect to misfit dislocations, it is considered that elongation occurs in order to alleviate stress in the vicinity of the aforementioned interface.

Furthermore, not only threading edge dislocations propagated from the SiC single crystal wafer, but also threading edge dislocation arrays may be formed in the SiC epitaxial film. Specifically, two threading edge dislocations newly generated at the time of epitaxial growth become paired, and this pair of two dislocations continuously repeats, extending in a row in the <1-100> direction in the case where the offcut direction is <11-20>, thereby forming a threading edge dislocation array. Due to occurrence of threading edge dislocation arrays, the dislocation density of the epitaxial film becomes higher than that of the single crystal wafer, resulting in degradation of crystal properties in epitaxial growth. This pair of threading edge dislocations is linked at its base in a half-loop shape by a basal plane dislocation. The existence of this half-loop was suggested in Non-Patent Document 3, but as its generative cause was unclear, a means for effectively reducing threading edge dislocation arrays was unclear, With respect to the aforementioned basal plane dislocations, it is known that they lower reliability in switching devices, and it would be desirable to reduce them. Moreover, threading edge dislocation arrays are edge dislocations that are newly generated in epitaxial film, and when the dislocation densities of the epitaxial film and the SiC single crystal wafer are compared, the dislocation density of the epitaxial film is higher due to these threading edge dislocation arrays. Consequently, it would be desirable to reduce them from the standpoint of achieving higher quality of the epitaxial film Non-Patent Document 1: X. Zhang, S. Ha, Y. Hanlumnyang, C. H. Chou, V. Rodriquez, M. Skowronski, J. J. Sumakeris, M. J. Paiseley and M. J. O'Loughlin, J. Appl. Phys. 101 (2007) 053517.

Non-Patent Document 2: H. Jacobson, J. P. Bergman, C. Hallin, E. Janzen, T. Tuomi and H. Lendenmann, J. Appl. Phys. 95 (2004), 1485.

Non-Patent Document 3: S. Ha et al., Journal of Crystal Growth 262 (2004), pp. 130-138.

DISCLOSURE OF THE INVENTION

Problems That the Invention is to Solve

The present invention was made in light of the foregoing circumstances, and its object is to offer an epitaxial SiC single crystal substrate which reduces threading edge dislocation arrays in SiC epitaxial film, and a method of manufacture of the epitaxial SiC single crystal substrate.

Means for Solving the Problems

As a result of diligent study by the inventors regarding the aforementioned problems, it was discovered that occurrence of threading edge dislocation arrays is closely related to misfit dislocations, and methods for reducing threading edge dislocation arrays were discovered based thereon. By adopting the following configurations, the present invention enables reduction of threading edge dislocation arrays.

(1) An epitaxial SiC single crystal substrate which includes a SiC single crystal wafer whose main surface is a c-plane or a surface that inclines a c-plane with an angle of inclination that is more than 0 degree but less than 10 degrees, and SiC epitaxial film that is formed on the main surface of the SiC single crystal wafer, wherein the dislocation array density of threading edge dislocation arrays formed in the SiC epitaxial film is 10 arrays/cm$^2$ or less.

(2) The epitaxial SiC single crystal substrate described in (1), wherein the main surface of the SiC single crystal wafer is inclined with an angle of inclination of more than 0 degrees but less than 10 degrees in a <11-20> direction relative to the c-plane.

(3) The epitaxial SiC single crystal substrate described in (1) or (2), wherein the threading edge dislocation arrays originate in elongation of basal plane dislocations in the vicinity of the interface of the SiC single crystal wafer and the aforementioned SiC epitaxial film.

(4) The epitaxial SiC single crystal substrate described in any of the items (1) to (3), wherein the length of threading edge dislocation arrays is 1 mm or less.

(5) The epitaxial SiC single crystal substrate described in any of the items (1) to (4), wherein crystal curvature of the c-plane in the SiC single crystal wafer is a convexity oriented toward the main surface of the SiC single crystal wafer.

(6) The epitaxial SiC single crystal substrate described in (5), wherein a curvature radius of the crystal curvature of the c-plane in the SiC single crystal wafer has a value that is continuously and uniformly convex relative to the main surface, and the curvature radius value is within a range from 10 m or more to 1000 m or less.

(7) The epitaxial SiC single crystal substrate described in any of the items (1) to (4), wherein the SiC single crystal wafer is convexly curved toward the side that contacts the SiC epitaxial film.

(8) The epitaxial SiC single crystal substrate described in (7), wherein the curvature of the SiC single crystal wafer oriented toward the side that contacts the SiC epitaxial film is continuously and uniformly convex in shape, and the value of that curvature (warpage) is within a range from 0.1 μm or more to 10 μm or less per 76 mm diameter of the SiC single crystal wafer.

(9) The epitaxial SiC single crystal substrate described in any of the items (1) to (4), wherein the SiC single crystal wafer has a differentiated region of carrier concentration and another region, and a difference in absolute value of carrier concentration between the differentiated region and the other region is 50% or less.

(10) The epitaxial SiC single crystal substrate described in any of the items (1) to (4), wherein a buffer region is formed between the SiC epitaxial film and the SiC single crystal wafer, and carrier concentration in the buffer region gradually increases toward the SiC single crystal wafer side, and a rate of change of the carrier concentration is 80% or less per 0.5 μm in the depthwise direction.

(11) The epitaxial SiC single crystal substrate described in any of the item (1) to (10), wherein thickness of the SiC single crystal wafer is 350 μm or more.

(12) The epitaxial SiC single crystal substrate described in any of the items (1) to (11), wherein a proportion of the threading edge dislocation arrays relative to the basal plane dislocations is 50% or less.

(13) A semiconductor device which is provided with the epitaxial SiC single crystal substrate described in any of the paragraphs (1) to (12).

(14) A method of manufacture of epitaxial SiC single crystal substrate, which includes a SiC single crystal wafer and a SiC epitaxial film formed on the main surface of a SiC single crystal wafer by epitaxial growth, including:

preparing a SiC single crystal wafer whose main surface is a c-plane or whose main surface is a surface which inclines a c-plane with an angle of inclination of more than 0 degrees but less than 10 degrees;

forming SiC epitaxial film by epitaxially grown on the main surface of the SiC single crystal wafer with adjustment of the temperature difference between the central part of the wafer and the periphery of the wafer during epitaxial growth to 0.1° C. or more and 100° C. or less, and with adjustment of the temperature distribution of the SiC single crystal wafer during epitaxial growth so that there is a positive temperature distribution from the central part of the wafer toward the periphery of the wafer; and obtaining an epitaxial SiC single crystal substrate in which dislocation array density of threading edge dislocation arrays is 10 arrays/cm$^2$ or less.

(15) The method of manufacture of epitaxial SiC single crystal substrate described in (14), wherein the main surface of the SiC single crystal wafer is inclined with an angle of inclination of more than 0 degrees but less than 10 degrees in the <11-20> direction relative to the c-plane.

(16) The method of manufacture of epitaxial SiC single crystal substrate described in (14) or (15), wherein hydrogen is used as carrier gas during epitaxial growth, and the flow rate of the hydrogen is 75 slm or less.

(17) The method of manufacture of epitaxial SiC single crystal substrate described in any of the items (14) to (16), wherein temperature during epitaxial growth is 1600° C. or more, growth speed of the SiC epitaxial film is 5 μm/h or more, and pressure during epitaxial growth is 300 Torr or less.

(18) The method of manufacture of epitaxial SiC single crystal substrate described in any of the items (14) to (17), wherein a SiC single crystal wafer is used in which crystal curvature of the c-plane is a convexity oriented toward the main surface.

(19) The method of manufacture of epitaxial SiC single crystal substrate described in (18), wherein a curvature radius of the crystal curvature of the c-plane in the SiC single crystal wafer has a value that is continuously and uniformly convex relative to the main surface, and the curvature radius value is within a range from 10 m or more to 1000 m or less.

(20) The method of manufacture of epitaxial SiC single crystal substrate described in any of the items (14) to (17), wherein a SiC single crystal wafer is used which is convexly curved toward the side that contacts the SiC epitaxial film.

(21) The method of manufacture of epitaxial SiC single crystal substrate described in (20), wherein curvature of the SiC single crystal wafer which is oriented (bulges) toward the side that contacts the SiC epitaxial film has a continuously and uniformly convex shape, and the value of the size of that curvature (warpage) is within a range from 0.1 μm or more to 10 μm or less per 76 mm diameter of the SiC single crystal wafer.

(22) The method of manufacture of epitaxial SiC single crystal substrate described in any of the items (14) to (17), wherein, as the SiC single crystal wafer, a SiC single crystal wafer is used in which a difference in absolute value of carrier concentration between the differentiated region of carrier concentration and the other region is 50% or less.

(23) The method of manufacture of epitaxial SiC single crystal substrate described in any of the items (14) to (17), further including a step of forming a buffer region on top of the SiC single crystal wafer before formation of the SiC epitaxial film, wherein carrier concentration contained in the buffer region gradually increases toward the SiC single crystal wafer side, and the rate of change of the carrier concentration is 80% or less per 0.5 μm in the depthwise direction.

(24) The method of manufacture of epitaxial SiC single crystal substrate described in any of the items (14) to (23), wherein thickness of the aforementioned SiC single crystal wafer is 350 μm or more.

(25) The method of manufacture of epitaxial SiC single crystal substrate described in any of the items (14) to (24), wherein a proportion of the aforementioned threading edge dislocation arrays relative to the basal plane dislocations is 50% or less.

(26) The method of manufacture of epitaxial SiC single crystal substrate described in any of the items (14) to (25), wherein a planetary-type crystal growth apparatus is used when forming the aforementioned SiC epitaxial film.

(27) A method of manufacture of semiconductor device which uses an epitaxial SiC single crystal substrate manufactured by the manufacturing method described in any of the items (14) to (26).

The epitaxial SiC single crystal substrate of (1), the semiconductor device provided with the epitaxial SiC single crystal substrate of (1) disclosed in (13), and the epitaxial SiC single crystal substrate disclosed in (14) constitute the first aspect, second aspect, and third aspect of the present invention. The remaining items (2) to (12) and (15) to (27) illustrate preferred examples of the present application, but the present invention is not limited to these alone.

Effects of the Invention

According to the present invention, it is possible to reduce the occurrence of threading edge dislocation arrays in SiC epitaxial film of epitaxial SiC single crystal substrates.

EXPLANATION OF REFERENCE NUMERALS

Figure 1:
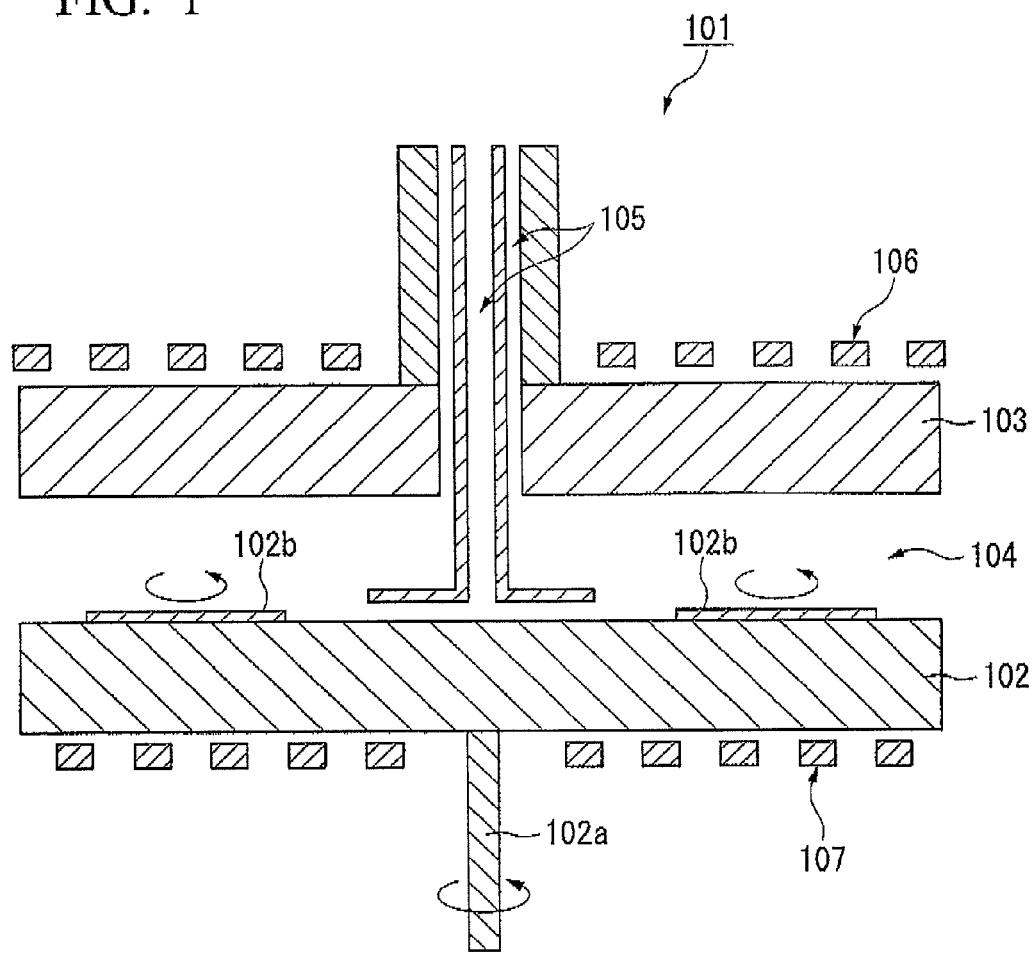
FIG. 1 is a sectional schematic view which shows an epitaxial growth apparatus used for an embodiment of the present invention.

1 SiC single crystal wafer
2 SiC epitaxial film
11 threading edge dislocation array

BEST MODE FOR CARRYING OUT THE INVENTION

Below, preferred embodiments of the present invention are described with reference to drawings. However, the present invention is not limited by these examples alone. Unless otherwise noted, numbers, positions, materials, etc. may be selected according to necessity.

The epitaxial SiC single crystal substrate of the present embodiment includes a SiC single crystal wafer and SiC epitaxial film formed on the main surface of the SiC single crystal wafer.

Threading edge dislocation arrays ordinarily occur in conventional SiC epitaxial but this dislocation array density is 10 arrays/cm$^2$ or less in the epitaxial SiC single crystal substrate of the present embodiment. If dislocation array density is 10 arrays/cm$^2$ or less, it is possible to mitigate device degradation in the case where a device is formed on the epitaxial SiC single crystal substrate. For purposes of use even with high-current devices, it is more preferable that dislocation array density be from 0 arrays or more to 0.5 arrays/cm$^2$ or less, and a threading edge dislocation density of zero is most preferable.

A threading edge dislocation array is pairs of threading edge dislocations that are connected in a half-loop by a basal plane dislocation. When the surface of the SiC epitaxial film is subjected to etching treatment by molten KOH, and when the surface of the SiC epitaxial film after etching is observed with an optical microscope, this threading edge dislocation array is observed in a state where pits formed from the pairs of threading edge dislocations are connected in a linear manner. With the epitaxial SiC single crystal substrate of the present embodiment, it is preferable that the length of a single threading edge dislocation array, which is observed as described above, be 1 mm or less; 0 mm or more to 0.1 mm or less is more preferable; and 0 mm or more to 0.01 mm or less is still more preferable. By achieving 1 mm or less, it is possible to mitigate the yield degradation of a device in the case where a device is formed on top of the epitaxial SiC single crystal substrate.

This threading edge dislocation array originates in elongation of a basal plane dislocation in the vicinity of the interface of a SiC single crystal wafer and SiC epitaxial film. That is, a basal plane dislocation incorporated within the SiC single crystal wafer is propagated to the SiC epitaxial film, and a portion of the propagated basal plane dislocation becomes a misfit dislocation that elongates at the vicinity of the interface of the SiC single crystal wafer and the SiC epitaxial film. This misfit dislocation then elongates so as to alleviate stress in the vicinity of the aforementioned interface, the distal end of the misfit dislocation converts to a threading edge dislocation near the growth surface of the epitaxial film, and this threading edge dislocation ultimately becomes a threading edge dislocation array. Accordingly, conduct of at least one—and preferably all three—of (I) to (III) below is effective in reducing threading edge dislocation arrays.

(I) Inhibit elongation of misfit dislocations by reducing stress in the vicinity of the aforementioned interface of the SiC epitaxial film.

(II) Inhibit propagation of basal plane dislocations, which are a cause of misfit dislocations, from the SiC single crystal wafer to the SiC epitaxial film.

(III) Inhibit conversion from misfit dislocation to threading edge dislocation by optimizing growth conditions of the SiC epitaxial film.

In order to reduce stress in the vicinity of the aforementioned interface as stated in (I), it would be sufficient to optimize the SiC single crystal wafer that constitutes the base material of the SiC epitaxial film. That is, in the present embodiment, it is preferable to use a SiC single crystal wafer with the following configuration.

The SiC single crystal wafer of the present embodiment is a single crystal wafer whose main surface is a c-plane, or whose main surface is a plane which inclines the c-plane with an angle of inclination of more than 0 degrees but less than 10 degrees. Specifically, it is a single crystal wafer of the 4H-SiC type. In the case where a single crystal wafer is used whose main surface is inclined relative to the c-plane, it is preferable that the main surface be inclined with an angle of inclination of more than 0 degrees but less than 10 degrees in the <11-20> direction relative to the c-plane. The main surface of a SiC single crystal wafer refers to the surface onto which SiC epitaxial film is laminated. Moreover, a c-plane refers to the (0001) plane of a 4H-SiC crystal. Furthermore, with respect to notation of the Miller index which expresses crystal orientation in the present description, when notation of an <11-20> direction is made, for example, the aforementioned "-2" signifies, properly speaking, the affixment of an overbar above the "2".

By having a SiC single crystal wafer whose main surface is a c-plane ((0001) plane) of the SiC crystal or whose main surface is a surface to which the c-plane is inclined at an inclination of more than 0 degrees but less than 10 degrees, SiC epitaxial film composed of 4H-SiC crystal wherein the crystal type thereof is same as the SiC single crystal wafer can be grown on top of the SiC single crystal wafer.

In addition, with respect to the SiC single crystal wafer, it is preferable that crystal curvature of the c-plane be continuously and uniformly convex toward the main surface of the wafer. To have crystal curvature of the c-plane continuously and uniformly convex signifies a smooth state without angularities in the crystal curvature of the c-plane, and without partial concavities in the SiC single crystal wafer. It is preferable that curvature radius of the crystal curvature of the c-plane be within a range from 10 m or more to 1000 m or less, and from 10 m or more to 300 m or less is more preferable. By having crystal curvature of the c-plane convexly shaped toward the main surface, although tensile stress is generated and expansive stress becomes pronounced in the SiC epitaxial compressive stress is alleviated, thereby enabling reduction of the dislocation array density of threading edge dislocation arrays. Here, in the case where curvature radius of the crystal curvature is less than 10 m, the expansive stress imparted to the SiC epitaxial film is excessively large, heightening risk of an increase in density, while in the case where curvature radius of the crystal curvature of the c-plane is greater than 1000 m, crystal curvature is substantially zero, rendering it difficult to make crystal curvature continuously and uniformly convex.

It is also preferable that the SiC single crystal wafer be warped (curved) in a continuously and uniformly convex form toward the main surface, that is, toward the side that contacts the SiC epitaxial film. To have the wafer warped in a continuously and uniformly convex form toward the main surface—that is, toward the side that contacts the SiC epitaxial film—signifies a smooth state without angularities in the crystal curvature of the wafer, and without partial concavities. It is preferable that the size of the curvature (warpage) of the SiC single crystal wafer be within a range from 0.1 μm or more to 10 μm or less per 76 mm diameter of SiC single crystal wafer, and from 5 μm or more to 10 μm or less is more preferable. By convexly warping the SiC single crystal wafer toward the side that contacts the SiC epitaxial film, although tensile stress is generated and expansive stress becomes pronounced in the SiC epitaxial film, compressive stress is alleviated, thereby enabling reduction of the dislocation array density of threading edge dislocation arrays.

There are several methods for measuring and quantifying the aforementioned warpage, and a "warp" value is used in the present description. "Warp" is defined as conducting measurement in a free state where the wafer is not chucked, and—using a focal plane as the reference plane—totaling the maximum values of vertical displacements from the plane. "Warp" is one of the indexes that are generally used when quantifying wafer warpage. In the case where the wafer form is a simple form such as a uniformly upward convexity, the measurement value of warp corresponds to the value of warpage as generally defined, and may therefore be considered to coincide. In the present text, when referring to form, "warpage" is used for purposes of explanation; and when there is a particular need to clearly indicate the quantification method in the examples, "warp" is used. Here, in the case where warpage is less than 0.1 μm per 76 mm diameter of SiC single crystal wafer, warpage is substantially zero, rendering it difficult to make warpage continuously and uniformly convex. In the case where warpage is greater than 10 μm per 76 mm diameter of SiC single crystal wafer, the expansive stress imparted to the SiC epitaxial film is excessively high, heightening the risk of an increase in the dislocation array density of threading edge dislocation arrays.

In the present invention, it is prescribed that the size of wafer warpage is preferably within a range from 0.1 μm or more to 10 μm or less per 76 mm diameter of single crystal wafer. However, this prescription does not limit the diameter of the SiC single crystal wafer of the present invention to 76 mm (3 inches) only. With respect to the present invention, even single crystal wafers of other diameters may be preferentially used, and the preferred range of warpage may also be changed according to wafer diameter. For example, if wafer diameter is 2 inches, the range of warpage amounts is from 0.067 μm to 6.7 μm; if wafer diameter is 3 inches, the range of warpage amounts is from 0.1 μm to 10 μm; and if wafer diameter is 4 inches, the range of warpage amounts is from 0.13 μm to 13.3 μm. In this manner, the present invention allows prescription of the relation of warpage amounts to diameter.

In the present invention, as the SiC single crystal wafer, it is possible to use one wherein the c-plane is curved, or one wherein the SiC single crystal wafer itself is convexly warped toward the main surface, that is, toward the side that contacts the SiC epitaxial film. In addition, it is also acceptable to use one wherein the c-plane is curved, and the SiC single crystal wafer itself is convexly warped.

Furthermore, a dopant such as nitrogen is preferably added to the SiC single crystal wafer of the present embodiment for purposes of controlling electrical resistance. It is preferable that dopant concentration (carrier concentration) be, for example, within a range from $1\times10^{15}$ cm$^{-3}$ to $1\times10^{19}$ cm$^{-3}$, and a range from $1\times10^{15}$ cm$^{-3}$ to $1\times10^{17}$ cm$^{-3}$ is more preferable.

It is preferable that dopant concentration of the SiC single crystal wafer be a fixed concentration within the plane of the main surface of the wafer, but a distribution in dopant concentration may occur during the manufacturing process of the SiC single crystal wafer. For example, it may happen that dopant concentration in a certain region on the main surface is higher than dopant concentration in other regions on the main surface. In the present embodiment, a region where dopant concentration is high is referred to as a "differentiated region of carrier concentration," while other regions are referred to as the "other region." This differentiated region appears, for example, as island-shaped on the main surface. With respect to the SiC single crystal wafer of the present embodiment, it is preferable to use one wherein the difference in absolute value between the dopant concentration of the differentiated region and the dopant concentration of the other region is 50% or less. In other words, in the case where dopant concentration of the differentiated region is considered as a ($cm^{-3}$) and dopant concentration of the other region is considered as b ($cm^{-3}$), it is preferable that b/a be within a range from 0.5 or more to 1 or less. It is undesirable when the difference in dopant concentration between the differentiated region and the other region exceeds 50% (when b/a is less than 0.5), because the dislocation array density of threading edge dislocation arrays increases.

The reasons for limiting the difference in dopant concentration between the differentiated region and the other region to 50% or less are explained below.

SiC single crystal has the property that the lattice constant of the SiC crystal decreases as dopant concentration increases. Accordingly, the SiC lattice constant in the differentiated region of carrier concentration is smaller than the lattice constant in the other region. Moreover, the lattice constant of SiC epitaxial film is substantially determined by dopant concentration, and is also influenced by the lattice constant of the SiC single crystal wafer that actually constitutes the substrate for epitaxial growth.

Now, when the SiC epitaxial film is epitaxially grown on top of the differentiated region of carrier concentration, this SiC epitaxial film grows in conformity with the lattice constant of the SiC single crystal of the differentiated region, with the result that the lattice constant of the SiC epitaxial film formed on the main surface of this portion is smaller than the natural lattice constant of epitaxial film.

On the other hand, the SiC epitaxial film formed on the other region grows in conformity with the lattice constant of the SiC single crystal of the other region, with the result that the lattice constant of the SiC epitaxial film formed on the main surface of this portion is larger than that of the epitaxial film on the differentiated region.

Thus, due to the existence of the differentiated region, a portion of large lattice constant and a portion of small lattice constant are produced in the main surface of the SiC epitaxial film. With respect to the portion where the lattice constant in the main surface is small, the condition exists that compressive stress is applied to the epitaxial film. Consequently, the dislocation array density of threading edge dislocation arrays tends to increase in the differentiated region.

The present inventors discovered that when reducing the dislocation array density of threading edge dislocation arrays, it is more effective to set the difference in dopant concentration between the differentiated region and the other region to 50% or less than to adjust the area ratio of the differentiated region in the main surface. By setting the dopant concentration difference to 50% or less, it is easier to set the dislocation array density of threading edge dislocation arrays to 10 arrays/$cm^2$ or less.

In the case where the difference in dopant concentration is set to 50% or less, it is preferable that, concomitantly, crystal curvature of the c-plane in the SiC single crystal wafer be given a convex form oriented toward the main surface of the wafer, or that the SiC single crystal wafer be convexly curved toward the side that contacts the SiC epitaxial film.

Furthermore, it is preferable that thickness of the SiC single crystal wafer be 350 μm or more, and a range from 350 μm or more to 600 μm or less is more preferable. If thickness is 350 μm or more, it is possible to fully inhibit increases in SiC single crystal wafer warpage originating in heat distribution during epitaxial growth. Consequently, the stress imparted to the SiC epitaxial film is reduced, thereby enabling diminution in the number of misfit dislocations in the epitaxial film, and enabling reduction of the dislocation array density of threading edge dislocation arrays. Here, in the case where thickness of the SiC single crystal wafer is less than 350 μm, an increase occurs in the warpage of the SiC single crystal wafer originating in irregularity of heat distribution during epitaxial growth, thereby raising the stress imparted to the SiC epitaxial film. As a result, there is a greater possibility that dislocation array density of threading edge dislocation arrays will increase due to an increase in the number of misfit dislocations in the epitaxial film.

In the present embodiment, there are no particular limitations on the thickness of the SiC epitaxial film nor on the dopant concentration (carrier concentration) when a dopant such as nitrogen is introduced into the SiC epitaxial film, and these may be selected according to necessity. It is preferable that thickness of the SiC epitaxial film be about 1-10 μm, and 6-10 μm is more preferable. Assuming a dopant concentration in the SiC epitaxial film in the range of, for example, $1 \times 10^{15}$ $cm^{-3}$ to $1 \times 10^{19}$ $cm^{-3}$, it is preferable to set the dopant concentration of the SiC single crystal wafer lower from the standpoint of enabling enhancement of pressure resistance of the device that is formed with the epitaxial SiC single crystal substrate. A more preferable dopant concentration would be in a range from $0.5 \times 10^{16}$ $cm^{-3}$ or more to less than $1 \times 10^{17}$ $cm^{-3}$.

In addition, it is preferable to provide a buffer region on the side of the SiC epitaxial film that contacts the SiC single crystal wafer. This buffer region moderates the dopant concentration difference of the SiC epitaxial film and the SiC single crystal wafer, and is configured so that dopant concentration (carrier concentration) contained in the buffer region gradually increases toward the SiC single crystal wafer side. It is preferable that thickness of the buffer region be 0.1 μm or more and 5 μm or less, and 0.1 μm or more and 3 μm or less is more preferable. It is preferable that this buffer region contacts the SiC single crystal wafer.

The dopant concentration of the SiC single crystal wafer is higher than the dopant concentration of the SiC epitaxial film. Consequently, a condition exists where stress concentration tends to occur at the interface of the SiC single crystal wafer and the SiC epitaxial film, and interfacial dislocations easily arise. Thus, by forming a buffer region on the side of the SiC epitaxial film that contacts the SiC single crystal wafer, stress concentration is alleviated at the interface of the SiC epitaxial film and the SiC single crystal wafer, thereby enabling prevention of occurrence of interfacial dislocations and reduction of the dislocation array density of threading edge dislocation arrays.

Moreover, it is preferable that the rate of change in carrier concentration in the buffer region be 80% or less per 0.5 μm of depth in the direction from the epitaxial film toward the SiC single crystal wafer. (With respect to the rate of change in carrier concentration, in the case where carrier concentration changes in the aforementioned direction, the concentration value of the portion where carrier concentration is high is used as reference, and the proportion of the variation values is expressed as a ratio.) It is undesirable when the rate of change exceeds 80%, as the variable range of dopant concentration becomes excessively large, stress in the epitaxial film increases, and the dislocation array density of threading edge dislocation arrays tends to increase.

By conducting control so that dopant concentration gradually decreases in the growth process of the SiC epitaxial film, the buffer region can be integrally formed with the SiC epitaxial film. The thickness of the buffer region may be suitably set according to the respective dopant concentrations of the SiC single crystal wafer and the SiC epitaxial film.

Next, the method of manufacture of epitaxial SiC single crystal substrate of the present embodiment is described.

First, the aforementioned SiC single crystal wafer is prepared. It is preferable that the main surface of the SiC single crystal wafer undergoes pre-treatment beforehand with RCA cleaning and the like.

Next, the SiC single crystal wafer is introduced into an epitaxial growth apparatus. With respect to the apparatus used for SiC epitaxial growth, several systems have been proposed; there are no particular limitations so long as growth conditions can be controlled, and selection may, be made according to necessity. In the present embodiment, an epitaxial growth apparatus of the planetary type is used which has excellent mass productivity. An epitaxial growth apparatus of the planetary type is a growth device with a format where gas supply is conducted from the center. With this planetary-type epitaxial growth apparatus, multiple wafers are horizontally disposed around the gas supply port. All the wafers are then made to revolve around the gas supply port, and the wafers themselves are spun on the axis of the wafer center. This is an epitaxial growth apparatus of the horizontal spin-orbit type. In addition, as this growth apparatus, it is preferable to use a hot-wall type which also heats the portion opposite the SiC single crystal wafer.

FIG. 1 shows one example of an epitaxial growth apparatus. An epitaxial growth apparatus 101 shown in FIG. 1 is roughly configured from a discoid planetary 102 composed of graphite, a discoid ceiling 103 composed of graphite, a reaction chamber 104 provided between the planetary 102 and ceiling 103, a gas supply unit 105 which transits the central part of the ceiling 103, and which supplies gas to the interior of the reaction chamber 104, and high-frequency coils 106 and 107 which respectively heat the planetary 102 and ceiling 103.

A rotary shaft for orbital movement 102a is attached to the central part of the bottom surface of the planetary 102, and multiple SiC single crystal wafer holders 102b (susceptors) are provided at the periphery of the top surface of the planetary 102 so as to surround the central part of the top surface. A rotary shaft for spinning which is not illustrated in the drawings is attached to each holder 102b. Moreover, the rotary shaft for orbital movement 102a is disposed directly under the gas supply unit 105.

According to the aforementioned configuration, the SiC single crystal wafers are made to revolve by the planetary 102 around the gas supply unit 105 as the center axis, and the SiC single crystal wafers are themselves made to spin by the holders 102b with the center of the SiC single crystal wafer as the axis.

With respect to this type of growth apparatus, as cold gas is introduced by the gas supply unit 105 disposed at the center, and as it is difficult to apply induction heating to the central part of the planetary 102, the temperature of the planetary 102 ordinarily tends to decline as the center is approached. Under this influence, temperature at the periphery of each of the susceptors 102b which spin, that is, temperature at the periphery of the SiC single crystal wafers mounted on top of the susceptors 102b tends to decline. Consequently, with respect to ordinary planetary-type epitaxial growth apparatuses, the mounted SiC single crystal wafers have a temperature gradient such that temperature at the central part of the wafer is highest, and temperature declines as the periphery of the wafer is approached. This temperature gradient of the SiC single crystal wafer causes compressive stress to occur at the central part of the SiC single crystal wafer in the epitaxial growth process.

This temperature gradient of the SiC single crystal wafer varies according to the flow rate of the gas that is introduced, changes in positioning of the induction heat coils, etc. In the present embodiment, it is preferable to adjust the flow rate of the introduced gas and the position of the induction heat coil so as to have a temperature gradient where temperature is lowest at the wafer center, and temperature increases as the wafer periphery is approached.

Next, SiC epitaxial film is grown on top of the main surface of the SiC single crystal wafer.

After mounting the SiC single crystal wafers onto the epitaxial growth apparatus of FIG. 1, raw material gas is supplied together with carrier gas from the gas supply unit. Raw material gas, carrier gas, dopant gas and so on may be selected as necessary. For example, a mixed gas of $SiH_4$ and $C_3H_8$ may be used as the raw material gas, and hydrogen may be used as the carrier gas. It is preferable that the C/Si mol ratio in the raw material gas be on the order of 0.3-3. In addition, when hydrogen is used as the carrier gas, it is preferable that the hydrogen flow rate be 75 slm or less, and from 50 slm or more to 75 slm or less is more preferable.

Growth conditions may be set according to necessity. It is preferable that growth speed of the SiC epitaxial film be set to 5 μm/h or more, that growth temperature be set to 1550° C. or more, and preferably to 1600° C. or more, and that atmospheric pressure during growth of the SiC epitaxial film be set to 300 Torr or less. It is more preferable that growth speed of the SiC epitaxial film be set to a range of 5 μm/h to 20 μm/h, that growth temperature be set to a range of 1600° C. to 1650° C., and that atmospheric pressure during growth of the epitaxial film be set to a range of 50 Torr to 300 Torr.

By growing SiC epitaxial film under such growth conditions, it is possible to inhibit the conversion of misfit dislocations to threading edge dislocations, and facilitate setting of the dislocation array density of threading edge dislocation arrays to 10 arrays/cm$^2$ or less.

Moreover, it is preferable to set the temperature distribution of the SiC single crystal wafer during epitaxial growth to a temperature distribution that is continuously and uniformly positive from the wafer center to the wafer periphery, that is, to cause a gradual increase in temperature from the wafer center toward the periphery, and to set the temperature difference of the wafer center and the wafer periphery to a range from 0.1° C. or more to 100° C. or less. By controlling temperature distribution of the SiC single crystal wafer in the aforementioned manner, expansive stress is generated in the SiC epitaxial film at the central part of the wafer. In particular, in the case where a SiC single crystal wafer is used which is convexly warped toward the side that contacts the SiC epitaxial film, expansive stress in the SiC epitaxial film is further intensified. By this means, it is possible to inhibit conversion of misfit dislocations to threading edge dislocations.

Here, in the case where the temperature difference of the wafer center and wafer periphery is lower than 0.1° C., the temperature gradient becomes substantially zero, and it is difficult to make temperature distribution continuously and uniformly positive, and in the case where the temperature difference of the wafer center and wafer periphery is higher than 100° C., temperature distribution becomes excessively large, heightening risk of an increase in defect density.

By growing SiC epitaxial film under the aforementioned manufacturing conditions, the proportion of threading edge dislocation arrays relative to basal plane dislocations including misfit dislocations in the SiC epitaxial film becomes 50% or less, and reduction of the density of threading edge dislocation arrays is facilitated.

The operational effects of the present embodiment are explained below centering on the generating mechanism of threading edge dislocation arrays.

"Generating Mechanism of Threading Edge Dislocation Arrays"

Figure 2:
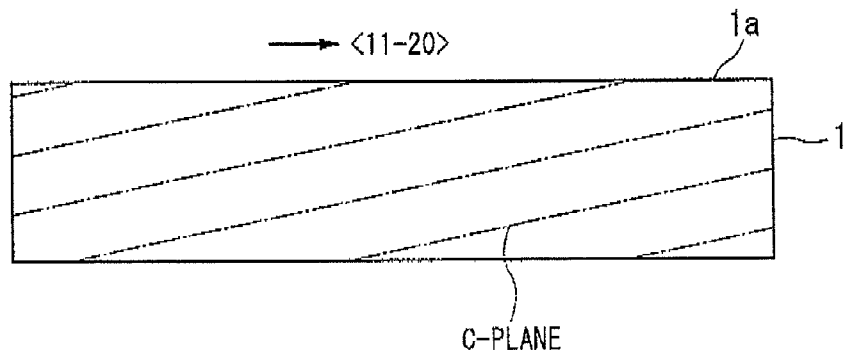
FIG. 2 is a sectional schematic view of a SiC single crystal wafer which is included in an epitaxial SiC single crystal substrate that is an embodiment of the present invention.
Figure 3:
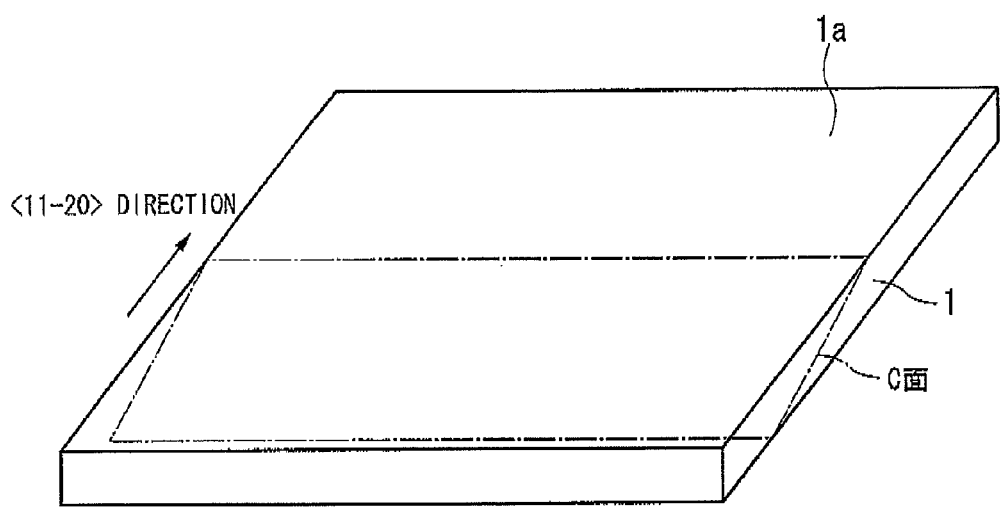
FIG. 3 is a perspective schematic view of a SiC single crystal wafer which is included in an epitaxial SiC single crystal substrate that is an embodiment of the present invention.

The generating mechanism of threading edge dislocation arrays will be explained now using the example of the case where SiC epitaxial film composed of 4H-SiC is formed on top of the main surface of a SiC single crystal wafer composed of 4H-SiC. A SiC single crystal wafer 1 (hereinafter sometimes referred to as a "wafer") shown in FIG. 2 and FIG. 3 is a SiC single crystal wafer wherein a main surface 1a is inclined with an angle of inclination of more than 0 degrees but less than 10 degrees in the <11-20> direction relative to a c-plane ((0001) plane) shown by dotted lines in the drawings. The angle of inclination in the drawings is drawn in an easy-to-understand manner, and may be considered to differ from the actual angle of inclination.

Figure 4:
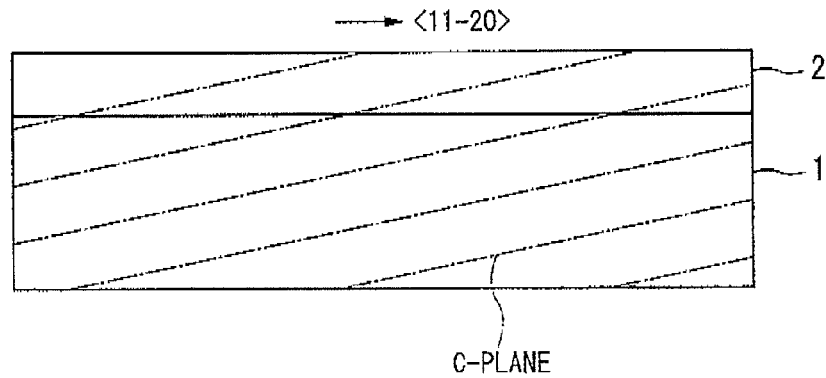
FIG. 4 is a sectional schematic view of an epitaxial SiC single crystal substrate that is an embodiment of the present invention.
Figure 5:
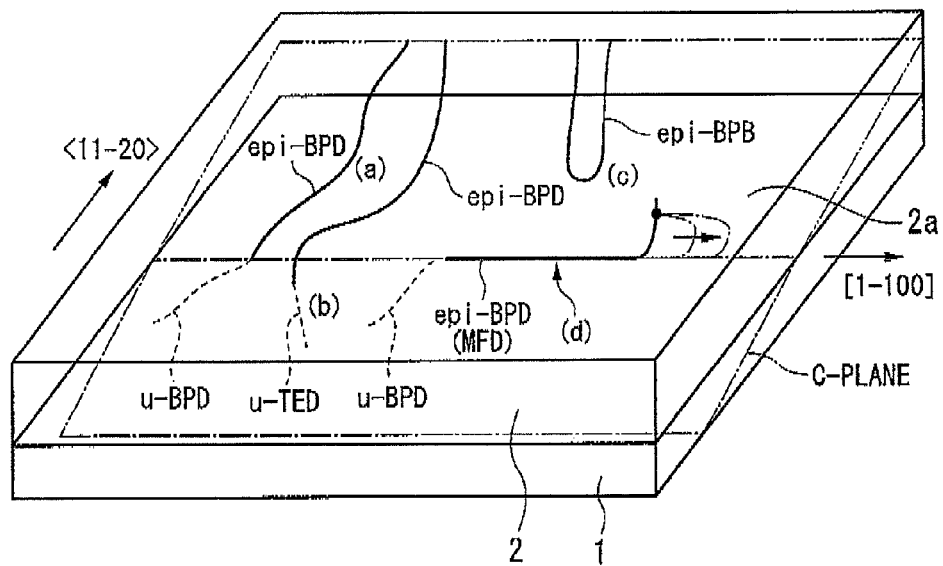
FIG. 5 is a perspective schematic view of an epitaxial SiC single crystal substrate that is an embodiment of the present invention.

As shown in FIG. 4 and FIG. 5, a SiC epitaxial film 2 (hereinafter sometimes referred to as "epitaxial film") is formed on the SiC single crystal wafer 1. The c-plane of SiC crystal of the epitaxial film 2 is formed parallel to the c-plane of the wafer 1, as shown by the double-dotted lines in the drawings.

At this time, as shown in FIG. 5, basal plane dislocations which are primarily of the three types (a) to (c) are generated in the epitaxial film 2. That is, at the interface of the wafer 1 and epitaxial film 2 (hereinafter referred to as "epi/sub interface") as shown by symbol (a) in FIG. 5, a basal plane dislocation (BPD (hereinafter referred to as "u-BPD")) existing within the wafer 1 is propagated to the epitaxial film 2 as a basal plane dislocation (BPD (hereinafter referred to as "epi-BPD")). In addition, as shown by symbol (b) in FIG. 5, a threading edge dislocation (TED (hereinafter referred to as "u-TED")) in the SiC single crystal wafer 1 is converted to a basal plane dislocation in the vicinity of the epi/sub interface, and is propagated to the SiC epitaxial film 2 as a basal plane dislocation (epi-BPD). Furthermore, as shown by symbol (c) in FIG. 5, a basal plane dislocation (epi-BPD) is newly generated in the epitaxial film in the vicinity of the epi/sub interface or apart from the vicinity of the epi/sub interface, and is propagated to the SiC epitaxial film 2 as a BPD. A portion of these basal plane dislocations in the SiC epitaxial film 2 are converted to threading edge dislocations during epitaxial growth, and are subsequently propagated as threading edge dislocations.

Stress arises in the epitaxial film 2 against the wafer 1 during epitaxial growth, and in the case where the stress is larger than a certain critical value, as shown by symbol (d) in FIG. 5, the basal plane dislocation epi-BPD in the epitaxial film elongates during epitaxial growth in a direction that runs directly in an offcut direction in the vicinity of the epi/sub interface in order to alleviate stress in the vicinity of the epi/sub interface. An epi-BPD which elongates in a direction that runs directly in this offcut direction is called a misfit dislocation (hereinafter written as "MFD").

At this time, the distal end of the epi-BPD which is the distal end part of the misfit dislocation appears in the growth surface 2a of the epitaxial film 2. With respect to this distal end, induced by elongation of the misfit dislocation in the vicinity of the epi/sub interface, its distal position moves in a direction that runs directly in the offcut direction. For example, when using a SiC single crystal wafer which offcuts in the <11-20> direction, the elongation direction of the misfit dislocation MFD in the vicinity of the epi/sub interface, and the direction of movement at the distal end of the misfit dislocation MFD on the epitaxial film surface are both in the <1-100> direction.

Figure 6:
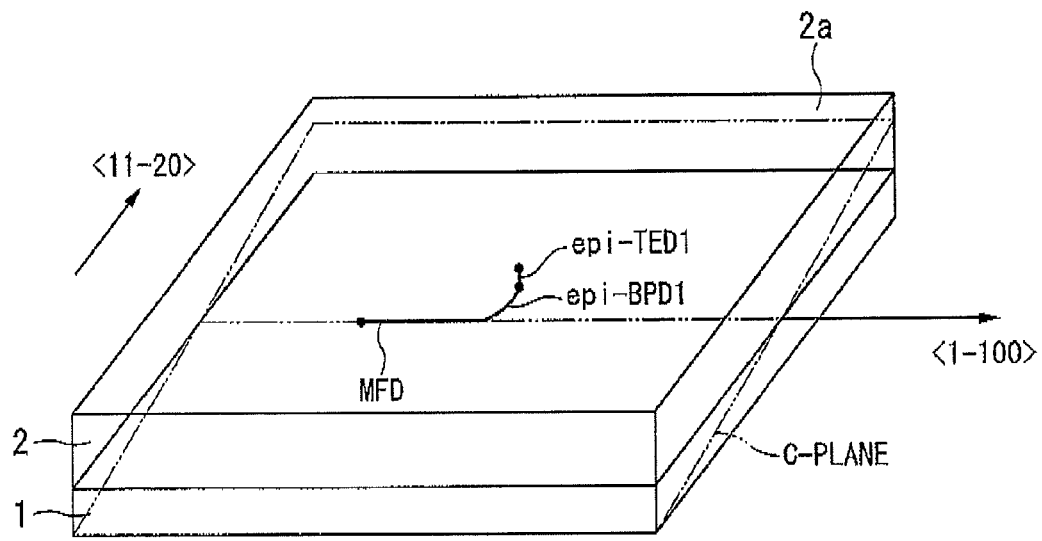
FIG. 6 is a sectional schematic view which explains the generating mechanism of threading edge dislocation arrays.
Figure 7:
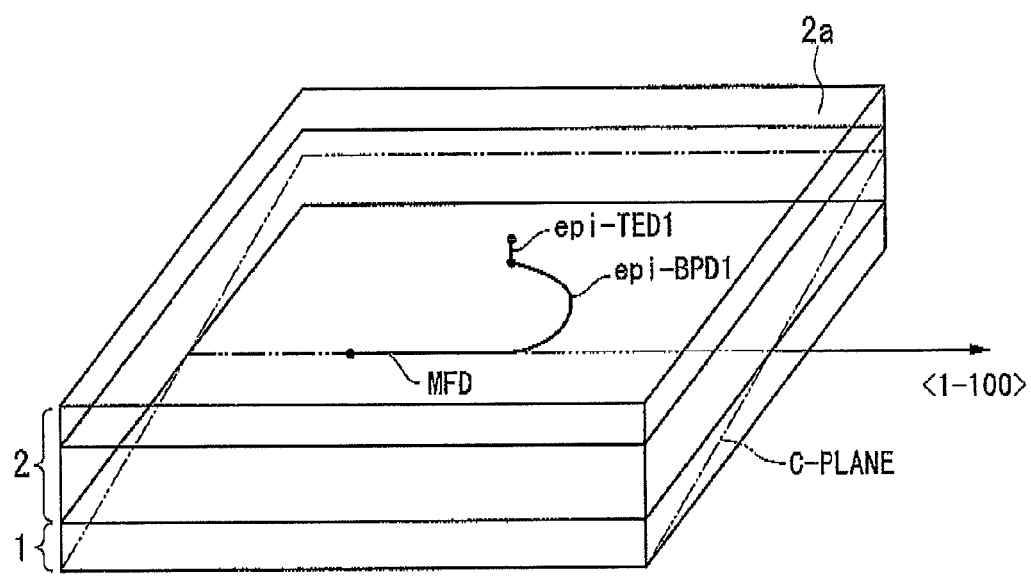
FIG. 7 is a sectional schematic view which explains the generating mechanism of threading edge dislocation arrays.

As shown in FIG. 6, while the distal position of the misfit dislocation MFD moves in a direction (the <1-100> direction) that runs directly in an offcut direction (<11-20>) during epitaxial growth, in a portion of the misfit dislocation, a basal plane dislocation (written as "epi-BPD1") which is the distal end converts to a threading edge dislocation (TED (hereinafter written as "epi-TED1") in a portion of the epitaxial growth surface. Furthermore, due to this portion that is converted to epi-TED1, the movement of epi-BPD1 is subjected to pinning. As elongation of the misfit dislocation MFD continues in the vicinity of the epi/sub interface even after pinning, the epi-BPD1 which is between the misfit dislocation MFD and the epi-TED1 is pulled along by this, and forms a bow shape in the SiC epitaxial film 2, as shown in FIG. 7.

Figure 8:
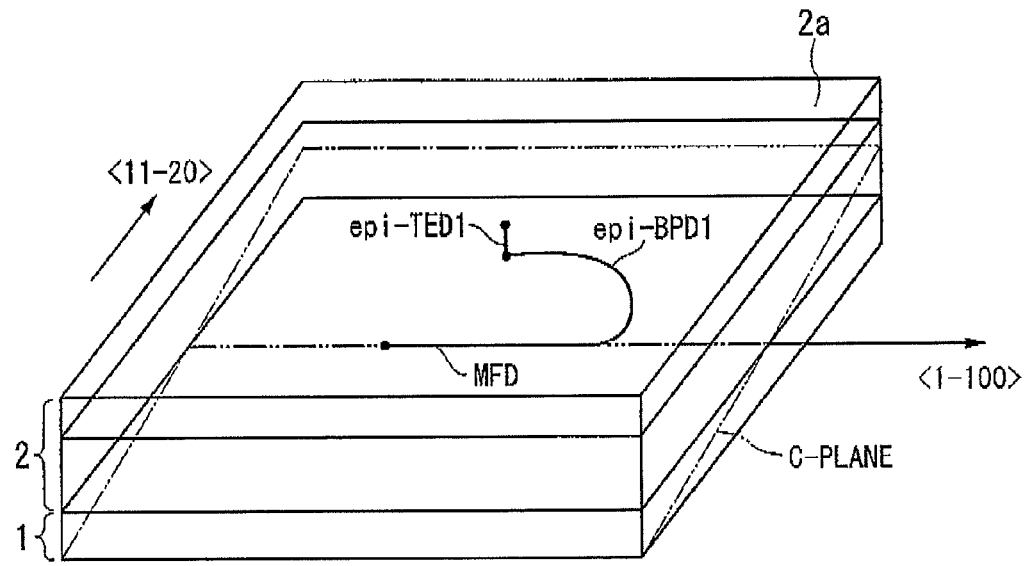
FIG. 8 is a sectional schematic view which explains the generating mechanism of threading edge dislocation arrays.
Figure 9:
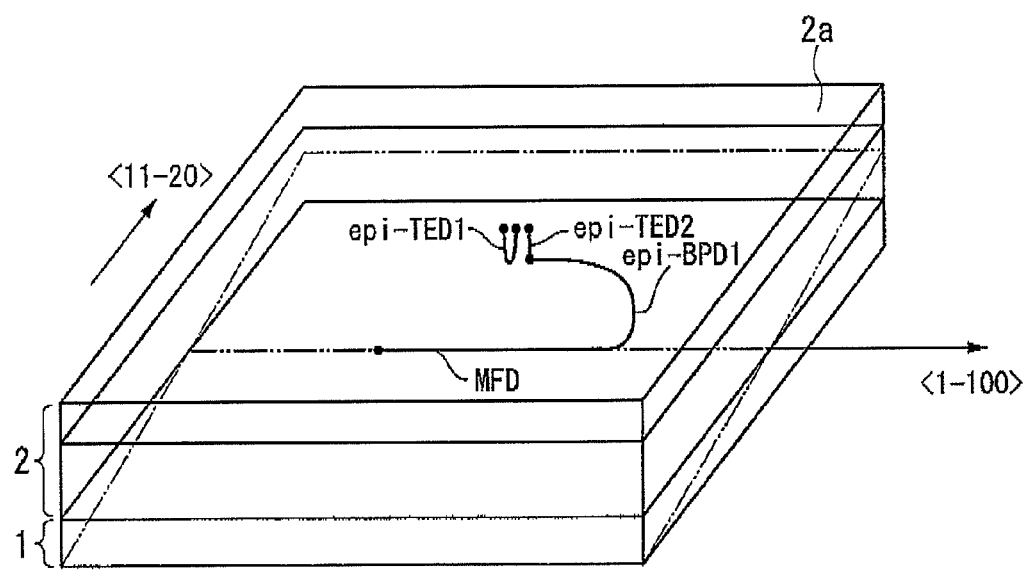
FIG. 9 is a sectional schematic view which explains the generating mechanism of threading edge dislocation arrays.

As shown in FIG. 8, in the vicinity of the bow-shaped epi-BPD1 in the growth surface 2a of the epitaxial film, the growth surface 2a and epi-BPD1 are approximately parallel, and epi-BPD1 is drawn even closer to the growth surface 2a by image force. At this time, the distal end of epi-BPD1 becomes epi-TED1, and is already subjected to pinning. As shown in FIG. 9, the epi-BPD1 that is the extended part of the bow-shaped portion that is drawn toward the growth surface 2a appears on the growth surface 2a of the epitaxial film, and is there converted into another threading edge dislocation (TED (hereinafter referred to as epi-TED2)).

Figure 10:
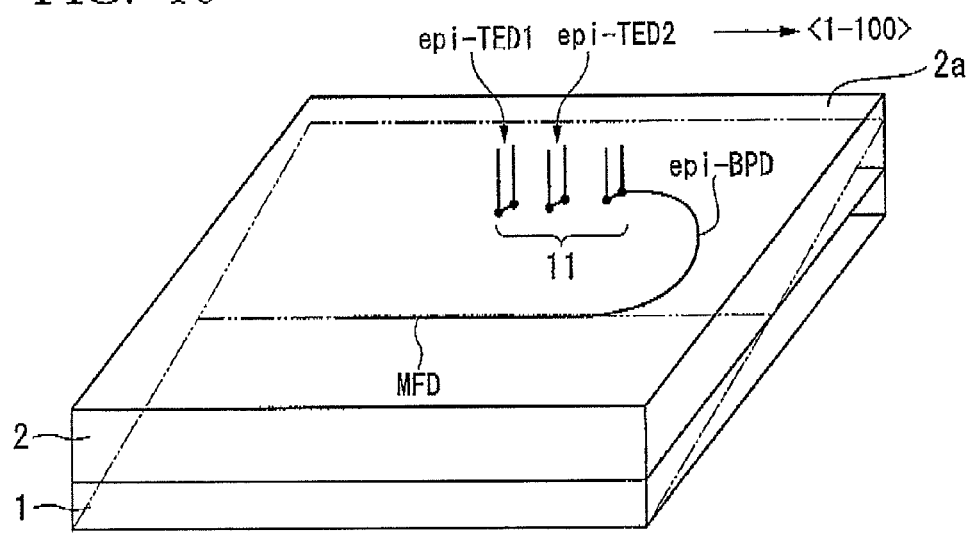
FIG. 10 is a plan schematic view which explains the generating mechanism of threading edge dislocation arrays.

When part of the distal portion of the extended part of the bow of epi-BPD1 appears on the growth surface 2a, the end of epi-BPD1 forms two parts, which subsequently respectively constitute an end of epi-TED (the discrete parts of the pair of epi-TED1 and the discrete parts of the pair of epi-TED2) on the surface. Consequently, as shown in FIG. 10, TED is unfailingly formed in a two-part pair. Thereafter, epi-BPD1, which is moved further in the epitaxial film, is again subjected to pinning by another TED that newly forms at its distal end, and this phenomenon is subsequently repeated.

The phenomenon described in FIG. 6 to FIG. 10 is repeated until the elongation of the misfit dislocation in the vicinity of the epi/sub interface ceases, that is, until stress in the vicinity of the epi/sub interface is sufficiently alleviated, resulting in formation of a misfit dislocation which elongates in the vicinity of the epi/sub interface, and a TED array 11 which is produced in the epitaxial film.

Thus, the generation of TED arrays is directly related to misfit dislocations. A TED array has BPDs on its bottom faces. Consequently, as with BPD, device reliability is adversely affected. As is clear from the generating mechanism, a TED array consisting of multiple TED pairs is generated from a single misfit dislocation. That is, as generation of a TED array signifies the propagation of BPD, it is important to reduce TED arrays.

Based on the above-described mechanism, as methods for reducing TED arrays, there are the means of (1) preventing generation of misfit dislocations which elongate in a direction that runs directly along an offcut direction in the vicinity of the epi/sub interface; (2) having misfit dislocations grow as is without conversion of epi-BPD (hereinafter written as epi-MFD/BPD), which moves in the epitaxial film 2 together with the misfit dislocation, into threading edge dislocations. By using these means, it is possible to manufacture high-quality epitaxial SiC single crystal substrates with few TED arrays. The means of (1) and the means of (2) are described below.

<Concerning the Methods of (1) Above: Methods for Preventing Generation of Misfit Dislocations>

As stated above, as misfit dislocations elongate in order to alleviate stress in the vicinity of the epi/sub interface, it would be sufficient to reduce stress in the vicinity of the aforementioned interface to prevent elongation of misfit dislocations. This stress in the vicinity of the aforementioned interface is induced by the crystal curvature of the wafer, the warpage of the wafer itself, or the temperature distribution of the wafer during epitaxial growth.

The stress which is the source of generation of misfit dislocations is explained below as a consequence of the crystal curvature or warpage of the wafer or the temperature distribution of the wafer.

In the wafer, basal plane dislocations u-BPD exist in the substrate surface with a density on the order of $10^3$ u-BPD/$cm^2$ to $10^4$ u-BPD/$cm^2$. Due to the existence of these u-BPD, the c-plane ((0001) plane) which is the basal plane of the SiC single crystal wafer is concavely or convexly curved.

When step-flow epitaxial growth is conducted on a main surface of a wafer containing such u-BPD, many (ordinarily 90% or more) of the u-BPD that are manifested on the main surface of the wafer are, as a consequence, converted into threading edge dislocations TED in the epitaxial film. At this time, the {1-100} plane of the epitaxial film curves according to the TED arrangement.

That is as mentioned above, with respect to the wafer, the c-plane adopts a concave or convex form due to the existence of u-BPD in the wafer, while with respect to the epitaxial film, epi-BPD1 are converted to epi-TED in the epitaxial film during epitaxial growth, with the result that the curvature components of the c-plane disappear, and instead the {1-100} plane in the epitaxial film adopts a concave or convex form. Accordingly, the epitaxial film where the c-plane is flat and the (1-100) plane is concave or convex is laminated on top of the main surface of the wafer where the c-plane is concave or convex, and stress consequently forms in the vicinity of the epi/sub interface. The size of this stress in the vicinity of the aforementioned interface is affected by BPD density in the wafer, the degree of crystal curvature of the c-plane of the SiC single crystal wafer, etc.

Thus, in the case where epitaxial growth is conducted with respect to a wafer which has crystal curvature originating in the existence of u-BPD, the stress imparted to the vicinity of the epi/sub interface increases as the film thickness of the epitaxial film increases. When stress in the vicinity of the aforementioned interface exceeds a certain value, a misfit dislocation is generated in the vicinity of the epi/sub interface.

There are cases where the c-plane ((0001) plane) of the wafer elastically curves even when u-BPD do not exist in the wafer. Such elastic crystal curvature may be produced by differences in the surface conditions (polishing, etc.) of the front face and rear face of the wafer, by temperature distribution in the wafer, etc. In this case, the c-plane ((0001) plane) of the epitaxial film also curves in conformity with the curvature of the wafer, and the stress imparted to the epitaxial film increases as the film thickness of the epitaxial film increases. At the point where the film thickness of the epitaxial film reaches a critical film thickness, a misfit dislocation is generated in the portion where the critical film thickness exists. The size of this stress is determined by the differences in surface conditions of the main surface of the wafer and the surface on the opposite side from the main surface, and by temperature distribution in the wafer. In the case where the wafer is placed on a susceptor inside an epitaxial growth furnace, and gas is made to flow toward the wafer in a state where high-frequency induction heat is applied to the susceptor, the temperature distribution of the wafer in its planar direction and cross-sectional vertical direction is determined according to the temperature distribution of the susceptor (also including the temperature distribution of the ceiling in the case of an epitaxial growth furnace of the hot-wheel type), the warpage of the wafer, and the flow-rate, pressure and so on of the gas, and each affects the size of the stress imparted to the epitaxial film.

With respect to actual epitaxial growth of 4H-SiC, it is thought that interfacial stress originating in conversion of u-BPD in the wafer into TED in the epitaxial film is mixed with stress originating in elastic curvature of the SiC single crystal wafer.

Based on the foregoing, the following (i) to (iv) may be cited as countermeasures for the alleviation of stress induced by elongation of misfit dislocations in a direction that runs directly along an offcut direction in the vicinity of the epi/sub interface.

(i) Reduce the u-BPD density of the SiC single crystal wafer, or reduce the crystal curvature of the SiC single crystal wafer.
(ii) Reduce the warpage of the SiC single crystal wafer.
(iii) Obtain uniform temperature distribution of the susceptor inside the epitaxial growth furnace.
(iv) Minimize the temperature distribution of the wafer by adjusting the flow rate and pressure of the gas.

It would seem to be practically difficult to substantially achieve all of (i) to (iv) above. As a result of diligent research conducted by the inventors, the following points were clarified.

(A) Generation of misfit dislocations is pronounced in portions where crystal curvature of the wafer is concave, but misfit dislocations are not generated in portions that are convex.
(B) Generation of misfit dislocations is pronounced in portions where wafer warpage is concave, but misfit dislocations are not generated in portions that are convex.
(C) In cases where the temperature distribution of the wafer is lowered at the wafer periphery, generation of misfit dislocations is pronounced in the central part of the wafer, but in cases where the temperature distribution of the wafer is not lowered at the wafer periphery, misfit dislocations are not generated in the central part of the wafer.

The discovery of (A) above is explained as follows.

In the case where crystal curvature of the c-plane of the wafer is concave, the u-BPD in the wafer axe converted to TED in the epitaxial film during epitaxial growth, with the result that compressive stress is applied to the epitaxial film. On the other hand, in the case where crystal curvature of the c-plane of the SiC single crystal wafer is convex, the u-BPD in the wafer are converted to TED in the epitaxial film during epitaxial growth, with the result that expansive stress is applied to the epitaxial film.

Moreover, in the case where crystal curvature of the c-plane of the wafer is concave, the crystal lattice of the epitaxial film contracts as the film thickness of the epitaxial film increases, with the result that compressive stress is further applied to the epitaxial film. On the other hand, in the case where crystal curvature of the c-plane of the wafer is convex, the crystal lattice of the epitaxial film expands as the film thickness of the epitaxial film increases, with the result that expansive stress is further applied to the epitaxial film. In these cases, even when stress having the same absolute value is applied, generation of misfit dislocations is pronounced when compressive stress is applied to the epitaxial film, and generation of misfit dislocations is inhibited when expansive stress is applied to the epitaxial film. That is, by giving the crystal curvature of the c-plane of the SiC single crystal wafer convexity toward the main surface of the wafer, it is possible to prevent elongation of misfit dislocations, and prevent occurrence of TED arrays which originate in the generation of misfit dislocations.

Next, the discovery of (B) above is explained as follows.

In the case where the warpage of the wafer on the topside of the main surface is concave, the contact of the wafer and the heating susceptor in the epitaxial growth furnace only occurs at the central part of the wafer. Accordingly, the central part of the wafer is excessively heated during epitaxial growth. At this time, a negative temperature gradient is produced from the central part of the wafer to the periphery of the wafer, i.e., temperature declines toward the periphery. As a result, compressive stress is applied to the central part of the wafer. This is because compressive stress is imparted in places of high temperature in the wafer plane, and expansive stress is imparted in places of low temperature. As the wafer warpage is concave, compressive stress is produced on the main surface side of the wafer. In this case, at the periphery of the wafer, the expansive stress due to the temperature gradient and the compressive stress due to warpage offset.

On the other hand, in the case where wafer warpage is convex toward the side that contacts the SiC epitaxial film, that is, toward the main surface side, the wafer and the heating susceptor come into contact at the wafer periphery, and the wafer periphery is excessively heated. At this time, a positive temperature gradient is produced from the central part of the wafer toward the periphery of the wafer, i.e., temperature rises toward the periphery. As a result, expansive stress is applied in the central part of the wafer. As wafer warpage is convex, expansive stress is produced in the central part of the wafer on the main surface side of the wafer. In this case, at the wafer periphery, the compressive stress due to the temperature gradient and the expansive stress due to warpage offset.

In these cases, even with stresses of the same absolute value, generation of misfit dislocations is pronounced when compressive stress is imparted to the epitaxial film, but generation of misfit dislocations is inhibited when expansive stress is imparted to the epitaxial film. That is, by making wafer warpage convex toward the side that contacts the SiC epitaxial film, it is possible to prevent elongation of misfit dislocations, and prevent occurrence of TED arrays which originate in the generation of misfit dislocations.

Next, the discovery of (C) above is explained as follows.

As stated in (A) and (B) above, in the case where crystal curvature of the c-plane of the wafer is convex and in the case where warpage of the wafer is convex, generation of misfit dislocations is inhibited. On the other hand, in the case where crystal curvature of the c-plane is concave and in the case where warpage of the wafer is concave, compressive stress is produced in the epitaxial film at the central part of the wafer, resulting in the possibility that misfit dislocations will be generated. As explained above, in the case where the temperature of the wafer has a positive temperature gradient from the central part of the wafer to the periphery, expansive stress is applied to the central part of the wafer due to this temperature gradient. Consequently, in the case where it is arranged so that the temperature of the wafer has a positive temperature gradient from the central part of the wafer to the periphery, even in the case where crystal curvature of the c-plane is concave or in the case where warpage of the wafer is concave, the compressive stress on the epitaxial film at the central part of the wafer is offset. As a result, it is possible to prevent elongation of misfit dislocations, and prevent occurrence of TED arrays which originate in the generation of misfit dislocations.

With respect to the temperature gradient of the wafer, in addition to the temperature distribution of the susceptor itself in the epitaxial growth furnace, it is possible to conduct control by the flow rate and pressure of the gas that flows toward the wafer. In an epitaxial growth apparatus of the planetary type where gas is supplied from the center, the gas flow reaches the spinning wafer from the peripheral side of the wafer, with the result that it is the periphery of the wafer that is cooled first by the gas flow. Consequently, in the settings of epitaxial growth apparatuses like the ordinary planetary type, the temperature of the wafer adopts a negative temperature distribution from the central part of the wafer to the periphery.

However, with respect to this temperature gradient, it is possible to arrange matters so that the temperature of the wafer adopts a positive temperature distribution from the central part of the wafer to the periphery by appropriately adjusting the distribution of the high-frequency induction amount applied to the susceptor.

As described above, according to the present invention, even if the crystal curvature of the SiC single crystal wafer, the warpage of the SiC single crystal wafer, or the temperature distribution of the SiC single crystal wafer are not substantially zero, it is possible to control the direction of the stress that is imparted to the epitaxial film by controlling the direction of crystal curvature, the direction of warpage, and the direction of temperature distribution, thereby enabling prevention of elongation of misfit dislocations in a direction that runs directly along an offcut direction in the vicinity of the epi/sub interface.

<Concerning the Methods of (2) Above: Methods for Conducting Growth with BPD as is Without Conversion of BPD to TED>

Next, the methods of (2) above is explained.

As described with respect to the generating mechanism of TED arrays, the generation of TED arrays is caused by the conversion of the distal portion of epi-MFD/BPD into epi-TED on the epitaxial growth surface.

Accordingly, even if misfit dislocations are generated with movement of the distal position of epi-MFD/BPD in a direction that runs directly along an offcut direction during epitaxial growth, if the distal portion of the epi-MFD/BPD is not converted to epi-TED, TED arrays will not be generated in the epitaxial film. It is possible to control the proportion of epi-MFD/BPD that convert to epi-TED in the epitaxial film by means of the growth speed of epitaxial film, growth temperature, atmospheric pressure, etc., and it is possible to maintain that proportion at 50% or less with the appropriate growth conditions.

To cite a specific example where BPD conversion to TED is minimized, in manufacture of an epitaxial SiC single crystal substrate where epitaxial film is formed on the main surface of the wafer, it is preferable that the temperature distribution of the SiC single crystal wafer during epitaxial growth be set to a positive temperature distribution from the central part of the wafer toward the periphery of the wafer, that the temperature difference between the central part of the wafer and the periphery of the wafer be set to $0.1°$ C. or more and $100°$ C. or less, that growth speed of the epitaxial film be set to 5 μ/h or more, that growth temperature be set to 1600° C. or more, and that atmospheric pressure during growth of the epitaxial film be set to 300 Torr or less.

According to the aforementioned conditions, it is possible to inhibit conversion from misfit dislocations MFD to threading edge dislocations TED, and reduce TED arrays.

When growth conditions of the epitaxial film deviate from the aforementioned ranges, conversion from misfit dislocations MFD to threading edge dislocations TED cannot be inhibited, and reduction of TED array density may prove infeasible.

Moreover, as stated above, as a factor in the generation of dislocation arrays in each process, the application of compressive stress to epitaxial film constitutes a major factor. In the epitaxial. SiC single crystal substrate of the present embodiment, in order to obtain the desired electrical properties, doping is conducted with respect to the SiC single crystal wafer and the SiC epitaxial film. With the n-type doping that is normally conducted, nitrogen is used as the dopant. Nitrogen exists in crystal in a form that is replaced with C in the SiC crystal which is the matrix. Consequently, in the case where doping is conducted with nitrogen at a high concentration, the SiC lattice constant shifts in the direction of diminution. Consequently, in the case where there exists a carrier concentration difference due to doping at the interface of the SiC epitaxial film and the SiC single crystal wafer, it is generally assumed for the below-mentioned reasons that the wafer is doped with a high concentration of nitrogen, and that compressive stress is applied to the epitaxial film side. The compressive stress that is a generative cause of dislocation arrays is locally generated in the main surface of the SiC single crystal wafer, and is a complex matter involving various factors as described above. It is thought that reduction of the stress caused by such doping is also one important means to be taken into account when reducing dislocation arrays.

In the SiC single crystal wafer, a differentiated portion is created in the main surface of the wafer where a difference in carrier concentration arises relative to the other portion due to the conditions under which the wafer is grown—this may also be called a "facet." In the case where nitrogen is used as the dopant, this differentiated portion has a higher carrier concentration than the surrounding portion. Accordingly, at the boundary of the differentiated portion and the surrounding portion, a large carrier concentration gradient occurs.

When SiC epitaxial film is laminated onto such a SiC single crystal wafer, complex stress which originates in the difference in lattice constants of the SiC epitaxial film and the SiC single crystal wafer occurs in the vicinity of the boundary of the differentiated portion. It has actually been confirmed that when epitaxial growth is conducted using a SiC single crystal wafer having such a differentiated portion, it results in a higher degree of likelihood that dislocation arrays will be generated in the surrounding area.

Consequently, it is preferable to use a SiC single crystal wafer which does not have a differentiated region where the difference in carrier concentration of the differentiated region and the other region is larger than 50%.

Generally, the SiC single crystal wafer is doped with a high concentration of nitrogen for purposes of reducing electrical resistance, while on the other hand, the SiC epitaxial film is doped with a low concentration of nitrogen due to design-related requirements for reverse pressure resistance. It would seem to be for this reason that compressive stress is imparted to the epitaxial film. In order to alleviate the stress due to such differences in carrier concentration, it is desirable to adopt countermeasures for the reduction of carrier concentration variation in the epitaxial SiC single crystal substrate. In particular, it is preferable to establish at any position in the depthwise direction in the SiC epitaxial film a buffer region where the carrier concentration variation rate per 0.5 μm is 80% or less.

The epitaxial SiC single crystal substrate of the present embodiment and its manufacturing method may be suitably used, for example, with respect to semiconductor devices in the field of so-called power devices such as power transistors and inverters as well as semiconductor light-emitting elements such as light-emitting diodes, and the manufacturing method for the same.

EXAMPLES

The present invention is described below in further detail by means of examples.

Example 1

As a SiC single crystal wafer of the 4H type, a wafer of 2-inch (50 mm) diameter was prepared wherein the main surface was a Si surface whose c-plane ((0001) plane) was inclined 8° in the <11-20> direction. The thickness of this wafer was 350 μm, and the entire wafer was convexly warped toward the side that contacted the SiC epitaxial film. The amount of warpage was 5 μm in terms of warp measurement value.

Next, as pre-treatment of the SiC single crystal wafer, organic solvent cleaning, acid and alkali cleaning, and adequate washing with water were conducted.

Growth of epitaxial film on the SiC single crystal wafer was conducted using a horizontal CVD (chemical vapor deposition) apparatus with a high-frequency induction heating system. The SiC single crystal wafer was horizontally disposed on the top face of a susceptor, and a hot-wall-system apparatus was used to heat it together with the opposite ceiling.

After horizontally disposing the SiC single crystal wafer on the susceptor, evacuation was conducted. Then, hydrogen gas was introduced, and adjustment conducted to a reduced-pressure atmosphere of 200 mbar. Subsequently, the temperature was raised to 1620° C., and growth of SiC epitaxial film was conducted to a thickness of 10 μm.

Hydrogen was used as the carrier gas, mixed gas of $SiH_4$ and $C_3H_6$ was used as the raw material gas, and $N_2$ was supplied as the dopant. Growth speed was set at 5 μm/h, and carrier concentration was set at $1 \times 10^{16}$ cm$^{-3}$.

In this manner, the epitaxial SiC single crystal substrate of Example 1 was manufactured.

With respect to the epitaxial SiC single crystal substrate of Example 1, in order to measure the dislocation array density of threading edge dislocation arrays (TED arrays) originating in elongation of basal plane dislocations (BPD) in the vicinity of the epi/sub interface, etching was conducted for 5 minutes with molten KOH of 510° C., and the length and number of threading edge dislocation, arrays was counted by observing the epitaxial film under an optical microscope.

Figure 11:
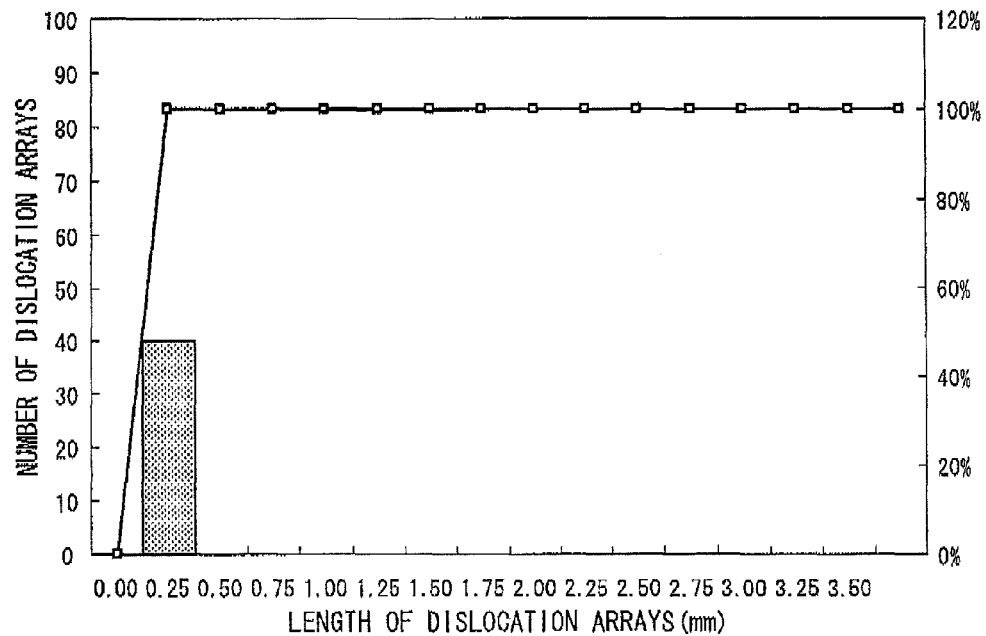
FIG. 11 is a histogram of the length of threading edge dislocation arrays, which treats the number of dislocation arrays of threading edge dislocation arrays of the epitaxial SiC single crystal substrate of Example 1 as a frequency.

FIG. 11 shows a histogram and a frequency distribution table wherein the number of occurrences in terms of dislocation array quantity of threading edge dislocation arrays is treated as frequency (vertical axis), and the length of the threading edge dislocation arrays is put on the horizontal axis.

As shown in FIG. 11, with respect to threading edge dislocation arrays, even the longest was within 1 mm, and dislocation array density in the epitaxial film was 2.0 arrays/cm$^2$.

Comparative Example 1

As a SiC single crystal wafer of the 4H-SiC type, a wafer of 3-inch (76-mm) diameter was prepared wherein the main surface was a Si surface whose c-plane ((0001) plane) was inclined 8° in the <11-20> direction. The thickness of this wafer was 350 μm, and the entire wafer was concavely warped toward the side that contacted the SiC epitaxial film. The amount of warpage was 15 μm in terms of warp measurement value.

Apart from use of this SiC single crystal wafer, the epitaxial SiC single crystal substrate of Comparative Example 1 was manufactured by forming epitaxial film in the same manner as the aforementioned Example 1.

With respect to the epitaxial SiC single crystal substrate of Comparative Example 1, the lengths and number of threading edge dislocation arrays were counted in the same manner as in Example 1.

Figure 12:
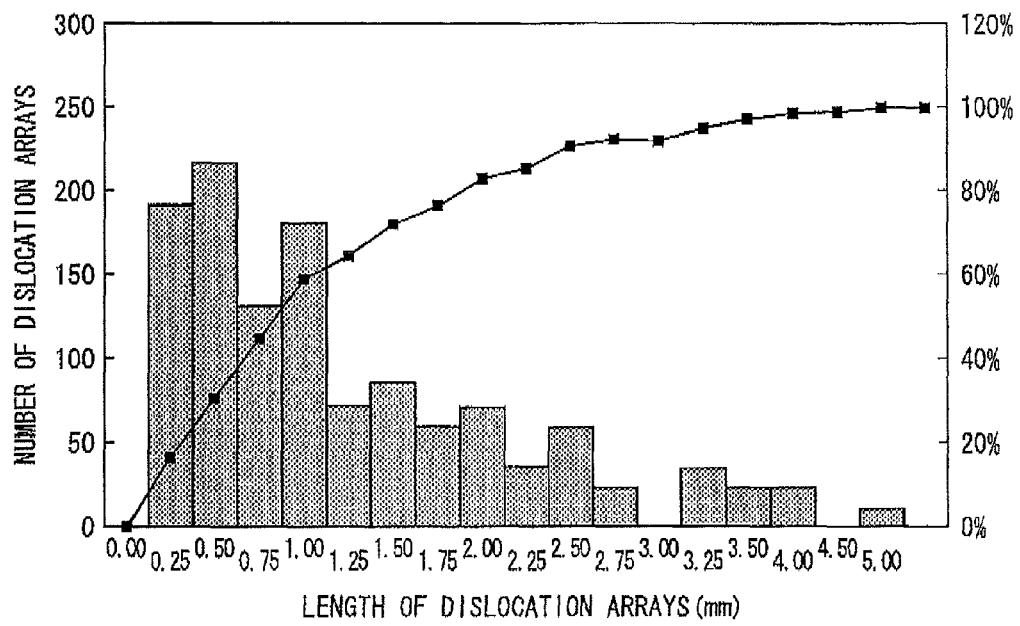
FIG. 12 is a histogram of the length of threading edge dislocation arrays, which treats the number of dislocation arrays of threading edge dislocation arrays of the epitaxial SiC single crystal substrate of Comparative Example 1 as a frequency.

FIG. 12 shows a histogram and a frequency distribution table wherein the number of occurrences in terms of the dislocation array quantity of threading edge dislocation arrays is treated as frequency (vertical axis), and the length of the threading edge dislocation arrays is put on the horizontal axis.

As shown in FIG. 12, the dislocation array density of threading edge dislocation arrays in the epitaxial film was 27.0 arrays/cm$^2$. Moreover, there were many occurrences of threading edge dislocation arrays with a length of 1 mm or more.

Experimental Example 1

With the objective of investigating the effects of SiC single crystal wafer thickness on the dislocation array density of threading edge dislocation arrays, multiple wafers with different thicknesses were compared.

As SiC single crystal wafers of the 4H-SiC type, wafers of 3-inch (76 mm) diameter and 280-370 μm thickness were prepared wherein the main surface was a Si surface whose c-plane ((0001) plane) was inclined 8° in the <11-20> direction. The wafers that were used were such that the entirety of the wafer was concavely warped toward the side that contacted the SiC epitaxial film. The amount of warpage was 15 μm in terms of warp measurement value.

Apart from use of the aforementioned SiC single crystal wafers, the epitaxial SiC single crystal substrates were manufactured by forming epitaxial film in the same manner as the aforementioned Example 1.

With respect to the obtained epitaxial SiC single crystal substrates, the dislocation array density of threading edge dislocation arrays was measured in the same manner as in Example 1. As for measurement of dislocation array density, the measurement region was a band-like region of 4 mm width that transited the center of the wafer in the diametral direction of the wafer.

Figure 13:
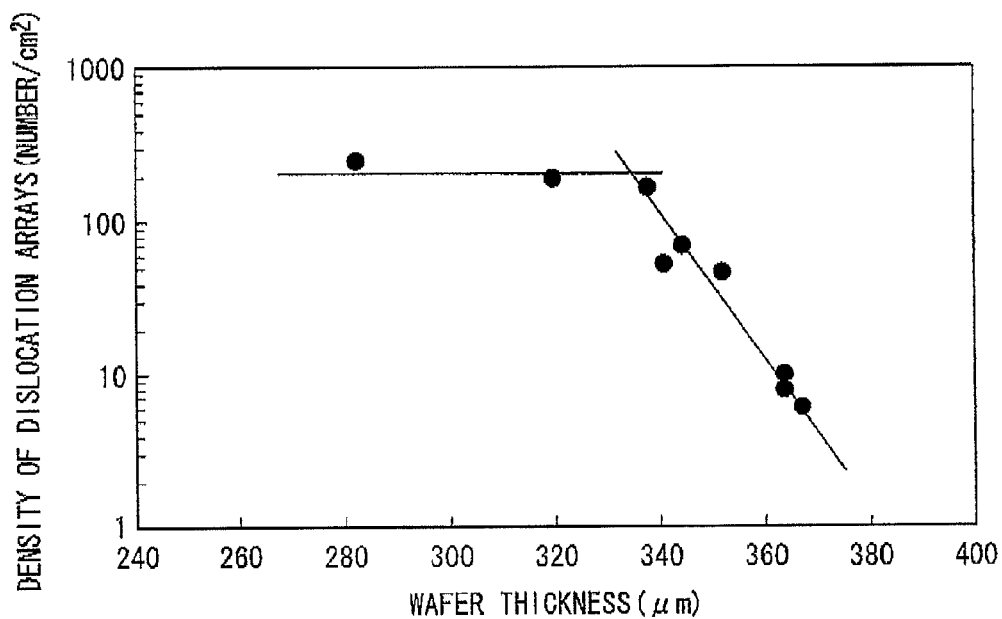
FIG. 13 is graph which shows the relation between thickness of the SiC single crystal wafer and density of dislocation arrays in the epitaxial SiC single crystal substrate of Example 1.

The relation of wafer thickness and dislocation array density is shown in FIG. 13.

As shown in FIG. 13, it was found that dislocation array density was 10 arrays/cm$^2$ or less with wafer thickness of approximately 350 μm or more.

Experimental Example 2

With the objective of investigating the effects of the warpage amount of SiC single crystal wafers on the dislocation array density of threading edge dislocation arrays, multiple wafers with different warpage amounts (warps) were compared.

As SiC single crystal wafers of the 4H-SiC type, wafers of 3-inch (76 mm) diameter and 350 μm thickness were prepared wherein the main surface was a Si surface whose c-plane ((0001) plane) was inclined 8° in the <11-20> direction. The wafers that were used were such that the entirety of the wafer was convexly warped toward the side that contacted the SiC epitaxial film. The warpage amounts of the wafers were 6-27 μm in terms of warp measurement value.

Apart from use of the aforementioned SiC single crystal wafers, the epitaxial SiC single crystal substrates were manufactured by forming epitaxial film in the same manner as the aforementioned Example 1.

With respect to the obtained epitaxial SiC single crystal substrates, the dislocation array density of threading edge dislocation arrays was measured in the same manner as in Example 1. As for measurement of dislocation array density, the measurement region was a band-like region of 4 mm width that transited the center of the wafer in the diametral direction of the wafer.

Figure 14:
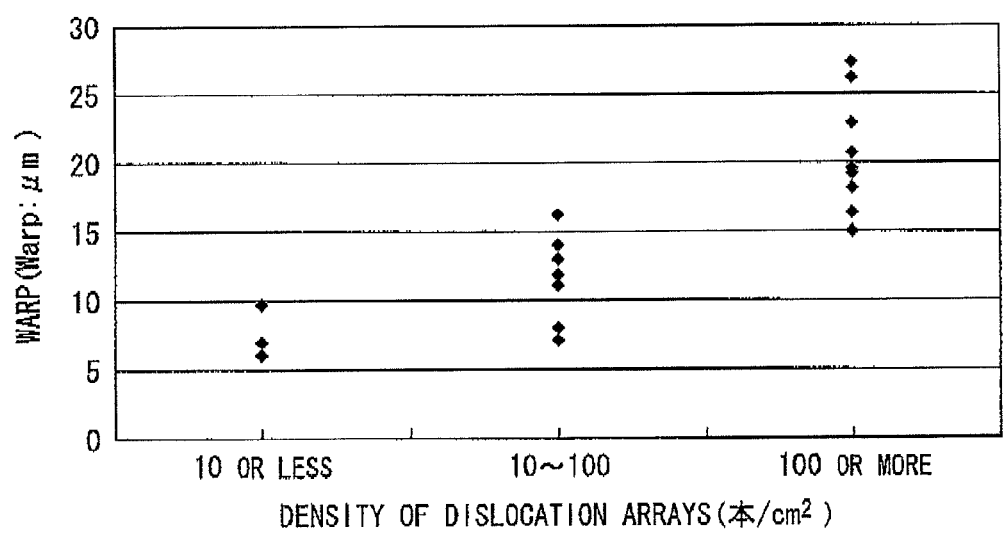
FIG. 14 is a graph which shows the relation between warpage amount of the SiC single crystal wafer and density of dislocation arrays in the epitaxial SiC single crystal substrate of Example 2.

The relation of wafer warpage amount and dislocation array density is shown in FIG. 14.

As shown in FIG. 14, it was found that dislocation array density was 10 arrays/cm$^2$ or less with wafer warpage amounts of 10 μm or less.

Experimental Example 3

An experiment was conducted with the objective of investigating the proportion of misfit dislocations that convert to threading edge dislocations in the epitaxial growth process.

As a SiC single crystal wafer of the 4H-SiC type, a wafer of 3-inch (76 mm) diameter was prepared wherein the main surface was a Si surface whose c-plane ((0001) plane) was inclined 8° in the <11-20> direction. The thickness of this wafer was 350 μm, and the wafer that was used was such that the entirety of the wafer was convexly warped toward the side that contacted the SiC epitaxial film. The amount of warpage was 15 μm in terms of warp measurement value. Apart from use of this SiC single crystal wafer, the epitaxial SiC single crystal substrate of Experimental Example 3 was manufactured by forming epitaxial film in the same manner as the aforementioned Example 1.

After termination of epitaxial growth, measurement of reflection X-ray topographs was conducted with the objective of investigating the density of misfit dislocations. In the case of this measurement, both misfit dislocations that converted to threading edge dislocations and misfit dislocations that did not convert to threading edge dislocations were observed as the same linear image, enabling observation of all misfit dislocations.

Next, the epitaxial SiC single crystal substrate of Experimental Example 3 was subjected to KOH etching by the same method as Example 1. Observation by optical microscope was then conducted in the same manner as Example 1. According to this measurement, it was possible to observe only misfit dislocations that converted to threading edge dislocations as dislocation arrays.

Figure 15:
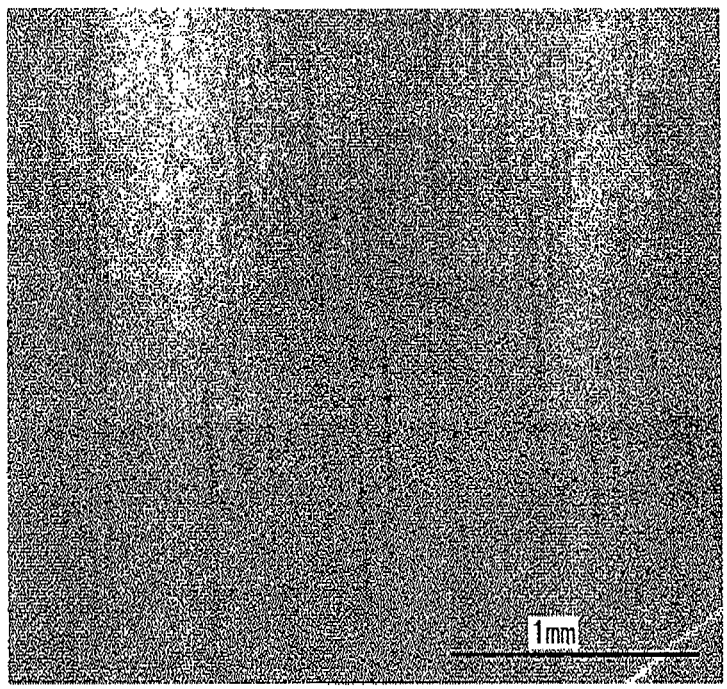
FIG. 15 is a reflection X-ray topographic photograph of the epitaxial SiC single crystal substrate of Example 3.
Figure 16:
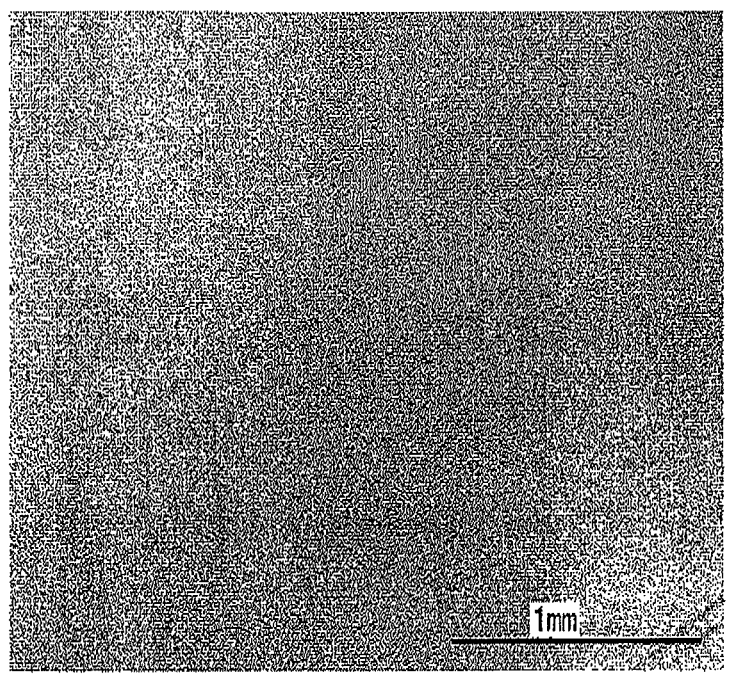
FIG. 16 is an optical photomicrograph taken of the epitaxial SiC single crystal substrate of Example 3 after KOH etching.
Figure 17:
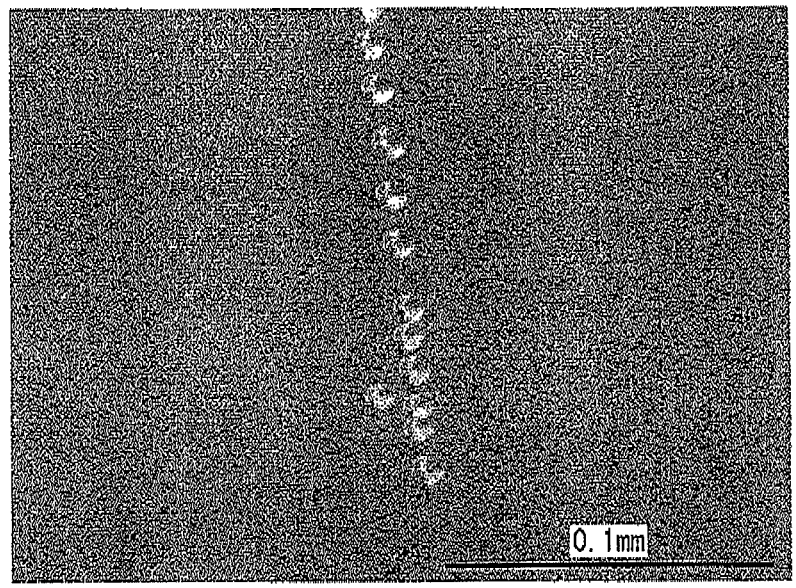
FIG. 17 is an enlargement of the photograph of FIG. 16.

FIG. 15 shows a reflection X-ray topographic photograph of the vicinity of the center of the epitaxial film. FIG. 16 shows a surface photograph of the same position after etching, and FIG. 17 is an enlargement of the photograph of FIG. 16. A threading edge dislocation array is shown in this FIG. 17.

From the results shown in FIG. 15 and FIG. 16, under the epitaxial growth conditions of this experimental example, there were 61 misfit dislocations that occurred and that were observed in the reflection X-ray topographic photograph, and there were 14 threading edge dislocation arrays that were observed in the surface photograph after KOH etching. That is, approximately 23% of misfit dislocations were converted to threading edge dislocations, and became dislocation arrays. Upon performing the same evaluation with respect to various places in the wafer plane, it was found that the proportion of misfit dislocations that were accompanied by threading edge dislocation arrays was approximately 10-30%. Moreover, it was also clear that as the density of misfit dislocations increased, threading edge dislocation array density also increased.

Experimental Example 4

An experiment was conducted with the objective of investigating the distribution of misfit dislocations in the wafer plane.

As a SiC single crystal wafer of the 4H-SiC type, a wafer of 2-inch (50 mm) diameter was prepared wherein the main surface was a Si surface whose c-plane ((0001) plane) was inclined 8° in the <11-20> direction. The thickness of this wafer was 350 μm, and the entire wafer was convexly warped toward the side that contacted the SiC epitaxial The amount of warpage was 25 μm in terms of warp measurement value.

The carrier concentration distribution of the SiC single crystal wafer was measured prior to epitaxial growth. There was a region of high carrier concentration in the main surface of the employed wafer, and the carrier concentration difference in the wafer surface was 60%. Apart from use of this type of SiC single crystal wafer, the epitaxial SiC single crystal substrate of Experimental Example 4 was manufactured by forming epitaxial film in the same manner as the aforementioned Experimental Example 1.

After termination of epitaxial growth, measurement of reflection X-ray topography was conducted with the objective of investigating the density of misfit dislocations. According to this measurement, cases where misfit dislocations existed could be observed by reflection X-ray topographic measurement.

Figure 18:
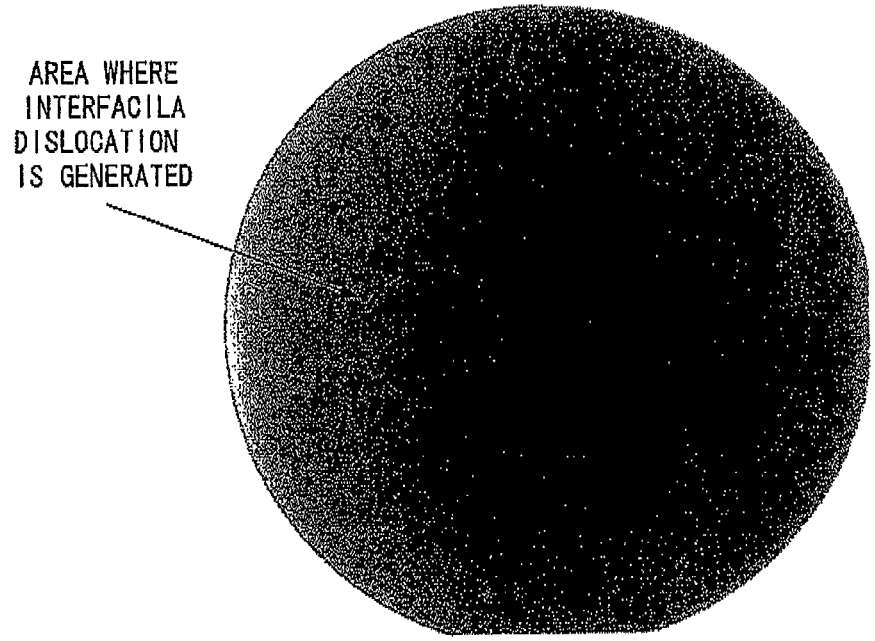
FIG. 18 is a reflection X-ray topographic photograph of the epitaxial SiC single crystal substrate of Example 4.
Figure 19:
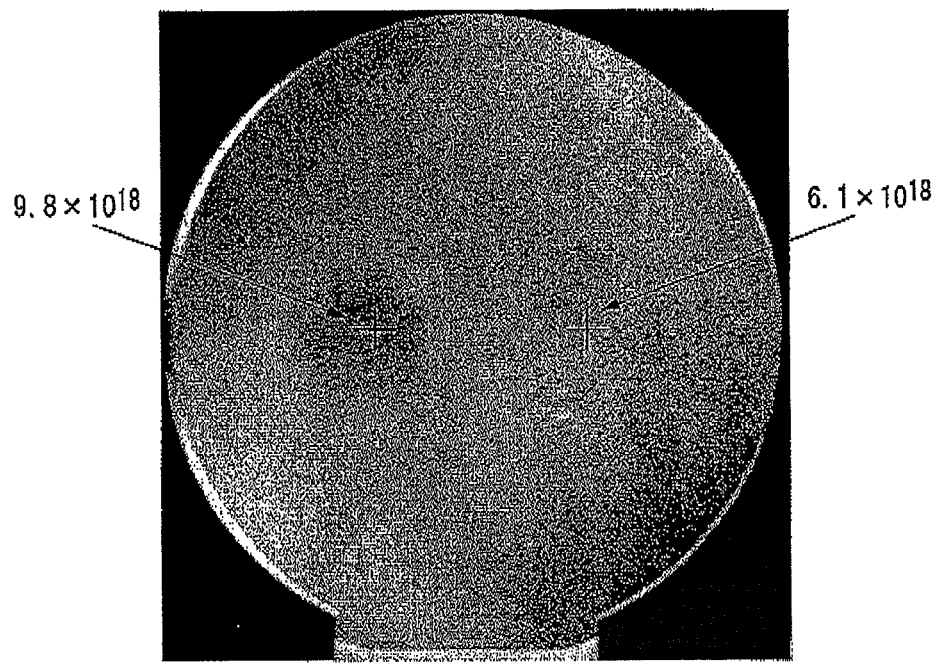
FIG. 19 is a drawing which shows the carrier concentration distribution of the epitaxial SiC single crystal substrate of Example 4.

FIG. 18 shows a reflection X-ray topographic photograph of the entire surface of the SiC epitaxial film of an epitaxial SiC single crystal substrate. In the region surrounded by the dotted line, occurrence of many misfit dislocations can be observed. FIG. 19 shows the measurement results for carrier concentration with a polarized light transmission image of the SiC single crystal wafer. Color variation can be seen in the SiC single crystal wafer due to differences in optical transmissivity resulting from contrasts in carrier concentration. Within the transmission image of the wafer of FIG. 19, the region of dark color is the differentiated region where carrier concentration is high. From the results shown in FIG. 18 and FIG. 19, it is found that, under the epitaxial growth conditions of the present experimental example, the misfit dislocations that occurred and that were observed in the reflection X-ray topographic photograph are concentrated in the differentiated region of high carrier concentration (carrier concentration: $9.8\times10^{18}$ cm$^{-3}$).

The number of misfit dislocations in this differentiated region was 50 dislocations/cm$^2$. According to the results of Experimental Example 3, it is estimated that approximately 10-30% of these misfit dislocations were accompanied by threading edge dislocations. In short, it is thought that threading edge dislocations occurred on the order of 5-15 dislocations/cm$^2$ in the carrier-concentration differentiated region of this wafer.

On the other hand, with respect to wafers that do not have a carrier-concentration differentiated region or wafers wherein the carrier concentration difference in the wafer surface is on the order of 10%, there are no regions where misfit dislocations occur in a concentrated manner, and the density thereof is roughly 0 dislocations/cm$^2$. From this, it may be said that the density of threading edge dislocation arrays caused by misfit dislocations is also roughly 0 arrays/cm$^2$.

From these results, in the case where the carrier concentration difference between the carrier-concentration differentiated region and the other region is 50% or less, it can be predicted that it is possible to form a wafer wherein the density of threading edge dislocation arrays is 10 arrays/cm$^2$ or less.

Experimental Example 5

An experiment was conducted with the objective of investigating changes in misfit dislocation density according to the degree of variation in the nitrogen concentration of the growth direction.

As a SiC single crystal wafer of the 4H-SiC type, a wafer of 3-inch (76 mm) diameter was prepared wherein the main surface was a Si surface whose c-plane ((0001) plane) was inclined 8° in the <11-20> direction. The thickness of this wafer was 250 μm, and the wafer that was used was such that the entire wafer was concavely warped toward the side that contacted the SiC epitaxial film. The amount of warpage was 20 μm in terms of warp measurement value.

On this SiC single crystal wafer, carrier concentration varied from $1\times10^{18}$ cm$^{-3}$ to $1\times10^{16}$cm$^{-3}$, and after forming a first layer (a buffer region of SiC epitaxial film) wherein the rate of change in carrier concentration was suppressed to 80% per 0.5 μm, a second layer (SiC epitaxial film) of 10 μm was formed wherein carrier concentration was $1\times10^{16}$ cm$^{-3}$. Apart from formation of this type of buffer region, the epitaxial SiC single crystal substrate of Experimental Example 5 was manufactured by forming epitaxial film in the same manner as the aforementioned Experimental Example 1.

Figure 20:
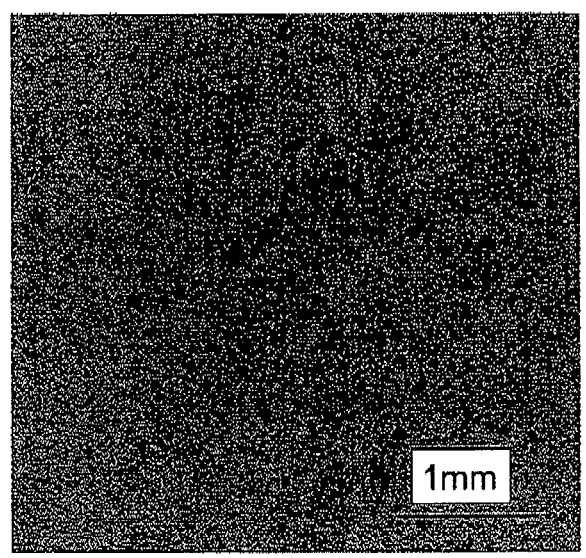
FIG. 20 is a reflection X-ray topographic photograph of the epitaxial SiC single crystal substrate of Example 5.

After termination of epitaxial growth, the existence of misfit dislocations was confirmed in the same manner as in Experimental Example 4. From the reflection X-ray topographic photograph shown in FIG. 20, it was found that misfit dislocations were not observed. From this, it may be said that the density of threading edge dislocation arrays that are caused by misfit dislocations is also roughly 0 arrays/cm$^2$.

On the other hand, with respect to an epitaxial SiC single crystal substrate wherein SiC epitaxial film with a carrier concentration of $1\times10^{16}$ cm$^{-3}$ was directly formed on top of a SiC single crystal wafer, there was occurrence of misfit dislocations. As a typical example, misfit dislocations like those shown in FIG. 15 of Experimental Example 3 occurred, causing threading edge dislocation arrays of 10 arrays/cm$^2$ or more. At this time, carrier concentration abruptly changed from the $10^{18}$ cm$^{-3}$ base of the substrate to the $1\times10^{16}$ cm$^{-3}$ of the SiC epitaxial film, which may be said to be a rate of change of 100%.

From these results, it is found to be preferable that the change in carrier concentration occur as gradually as possible. However, as film thickness increases when it occurs too gradually, an increase in the resistance values of device properties would result. In the present examples, a study was made as to rates of change in carrier concentration which maximally suppress increases in film thickness, and it was shown that occurrence of misfit dislocations can be inhibited if the rate of change is 80% per 0.5 μm and less than that. From these findings, it may be said to be possible to form a wafer wherein the density of threading edge dislocation arrays is 10 arrays/cm$^2$ or less by providing this type of carrier-concentration change layer.

Industrial Applicability

An epitaxial SiC single crystal substrate which reduces threading edge dislocation arrays in SiC epitaxial film is offered, as well as a method of manufacture of the epitaxial SiC single crystal substrate.

The invention claimed is:

1. A method of manufacture of an epitaxial SiC single crystal substrate, which includes a SiC single crystal wafer and a SiC epitaxial film formed on the main surface of a SiC single crystal wafer by epitaxial growth, comprising:
preparing a SiC single crystal wafer whose main surface is a c-plane or whose main surface is a surface which inclines a c-plane with an angle of inclination of more than 0 degrees but less than 10 degrees;
forming SiC epitaxial film by epitaxially grown on the main surface of the SiC single crystal wafer with adjustment of a temperature difference between the central part of the wafer and the periphery of the wafer during epitaxial growth to 0.1° C. or more and 100° C. or less, and with adjustment of a temperature distribution of the SiC single crystal wafer during epitaxial growth so that there is a positive temperature distribution from the central part of the SiC single crystal wafer toward the periphery of the SiC single crystal wafer; and
obtaining an epitaxial SiC single crystal substrate in which a dislocation array density of threading edge dislocation arrays is 10 arrays/cm$^2$ or less.

2. The method of manufacture of the epitaxial SiC single crystal substrate according to claim 1, wherein the main surface of said SiC single crystal wafer is inclined with an angle of inclination of more than 0 degrees but less than 10 degrees in a <11-20> direction relative to the c-plane.

3. The method of manufacture of the epitaxial SiC single crystal substrate according to claim 1, wherein hydrogen is used as carrier gas during the epitaxial growth, and a flow rate of said hydrogen is 75 slm or less.

4. The method of manufacture of the epitaxial SiC single crystal substrate according to claim 1, wherein temperature during the epitaxial growth is 1600° C. or more, a growth speed of the SiC epitaxial film is 5 µm/h or more, and a pressure during the epitaxial growth is 300 Torr or less.

5. The method of manufacture of the epitaxial SiC single crystal substrate according to claim 1, wherein the SiC single crystal wafer is one in which crystal curvature of said c-plane is a convexity oriented toward said main surface.

6. The method of manufacture of the epitaxial SiC single crystal substrate according to claim 5, wherein a curvature radius of the crystal curvature of said c-plane in said SiC single crystal wafer has a value that is continuously and uniformly convex relative to said main surface, and the curvature radius value is within a range from 10 m or more to 1000 m or less.

7. The method of manufacture of the epitaxial SiC single crystal substrate according to claim 1, wherein the SiC single crystal wafer is convexly curved toward the side that contacts the SiC epitaxial film.

8. The method of manufacture of the epitaxial SiC single crystal substrate according to claim 7, wherein curvature of said SiC single crystal wafer oriented toward the side that contacts the SiC epitaxial film has a continuously and uniformly convex shape, and a value of a size of that curvature is within a range from 0.1 µm or more to 10 µm or less per 76 mm diameter of said SiC single crystal wafer.

9. The method of manufacture of the epitaxial SiC single crystal substrate according to claim 1, wherein, as said SiC single crystal wafer, the SiC single crystal wafer is used in which a difference in absolute value of carrier concentration between a differentiated region of carrier concentration and the other region is 50% or less.

10. The method of manufacture of the epitaxial SiC single crystal substrate according to claim 1, further including a step of forming a buffer region on top of said SiC single crystal wafer before formation of said SiC epitaxial film,
wherein the carrier concentration contained in the buffer region gradually increases toward said SiC single crystal wafer side, and a rate of change of said carrier concentration is 80% or less per 0.5 µm in a depthwise direction.

11. The method of manufacture of the epitaxial SiC single crystal substrate according to claim 1, wherein thickness of said SiC single crystal wafer is 350 µm or more.

12. The method of manufacture of the epitaxial SiC single crystal substrate according to claim 1, wherein a proportion of said threading edge dislocation arrays relative to basal plane dislocations is 50% or less.

13. The method of manufacture of the epitaxial SiC single crystal substrate according to claim 1, wherein a planetary-type crystal growth apparatus is used when forming said SiC epitaxial film.

14. A method of manufacture of semiconductor device which uses the epitaxial SiC single crystal substrate manufactured by the manufacturing method according to claim 1.

* * * * *